(12) United States Patent
Ozaki et al.

(10) Patent No.: US 11,387,357 B2
(45) Date of Patent: Jul. 12, 2022

(54) COMPOUND SEMICONDUCTOR DEVICE, METHOD FOR MANUFACTURING THE SAME AND AMPLIFIER

(71) Applicant: FUJITSU LIMITED, Kawasaki (JP)

(72) Inventors: Shirou Ozaki, Yamato (JP); Toshihiro Ohki, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 155 days.

(21) Appl. No.: 16/940,474

(22) Filed: Jul. 28, 2020

(65) Prior Publication Data

US 2021/0036139 A1 Feb. 4, 2021

(30) Foreign Application Priority Data

Aug. 1, 2019 (JP) .............................. JP2019-142479

(51) Int. Cl.
*H01L 29/778* (2006.01)
*H03F 3/21* (2006.01)
*H01L 23/66* (2006.01)
*H01L 29/66* (2006.01)
*H03F 3/193* (2006.01)

(52) U.S. Cl.
CPC .......... *H01L 29/7786* (2013.01); *H01L 23/66* (2013.01); *H01L 29/66462* (2013.01); *H03F 3/193* (2013.01); *H03F 3/21* (2013.01); *H01L 2223/6644* (2013.01)

(58) Field of Classification Search
CPC .................................................. H01L 29/7786
See application file for complete search history.

(56) References Cited

U.S. PATENT DOCUMENTS

2013/0240896 A1\* 9/2013 Ozaki ............... H01L 29/66431
438/285
2015/0069469 A1 3/2015 Saito
2016/0079066 A1 3/2016 Takada et al.

FOREIGN PATENT DOCUMENTS

JP 2015-056457 A 3/2015
JP 2016-062976 A 4/2016

\* cited by examiner

*Primary Examiner* — William A Harriston
(74) *Attorney, Agent, or Firm* — Fujitsu Patent Center

(57) ABSTRACT

A compound semiconductor device includes: a semiconductor laminate structure including an electron transit layer and an electron supply layer that are formed from a compound semiconductor; a gate electrode, a source electrode, and a drain electrode that are provided above the electron supply layer; and an insulating layer that is provided between the source electrode and the drain electrode, over the semiconductor laminate structure, and with a gate recess formed therein, wherein the gate electrode includes: a first portion in the gate recess; and a second portion that is coupled to the first portion and is provided over the insulating layer at a position further on the drain electrode side than the gate recess, wherein the insulating layer includes an aluminum oxide film in direct contact with the semiconductor laminate structure.

11 Claims, 21 Drawing Sheets

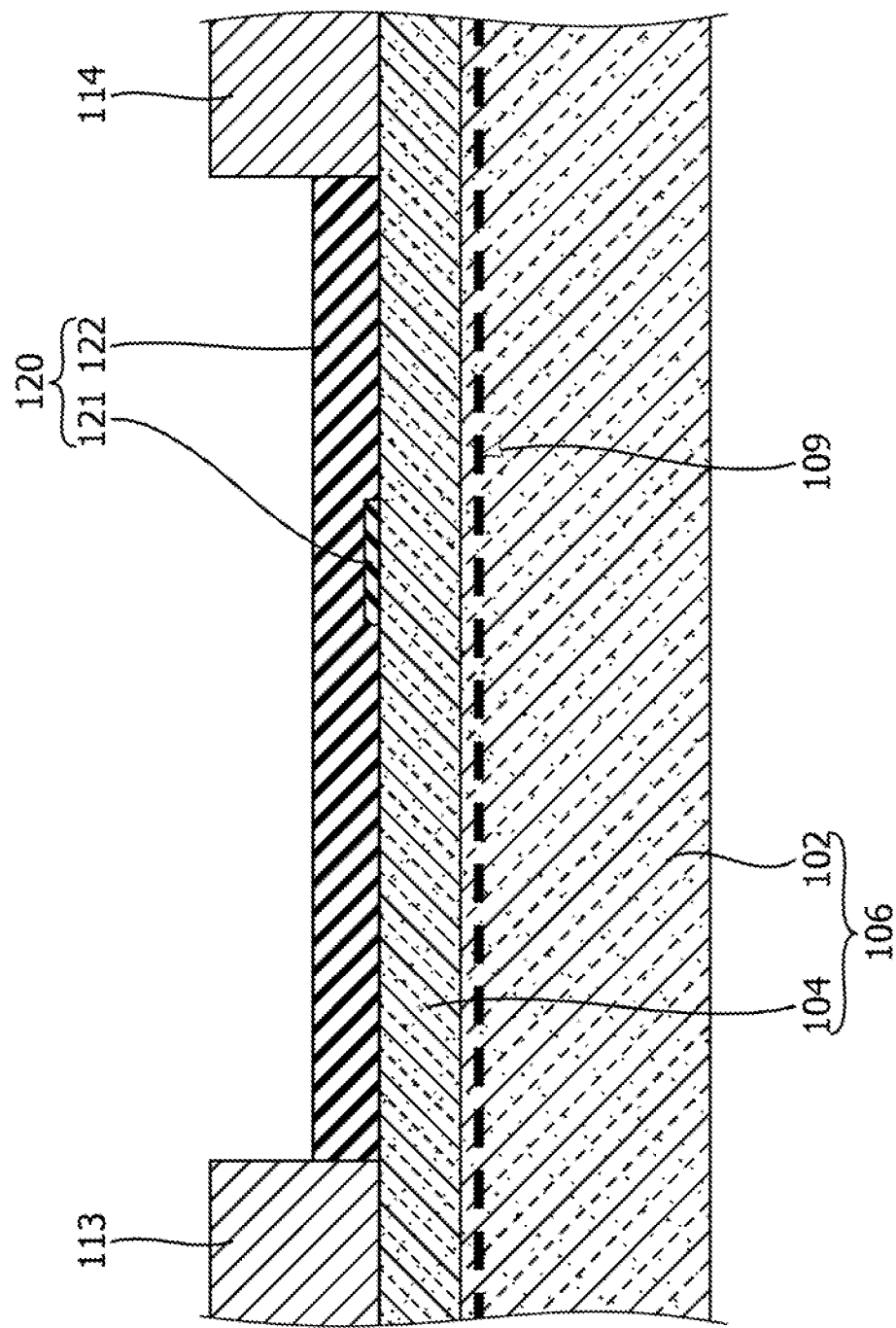

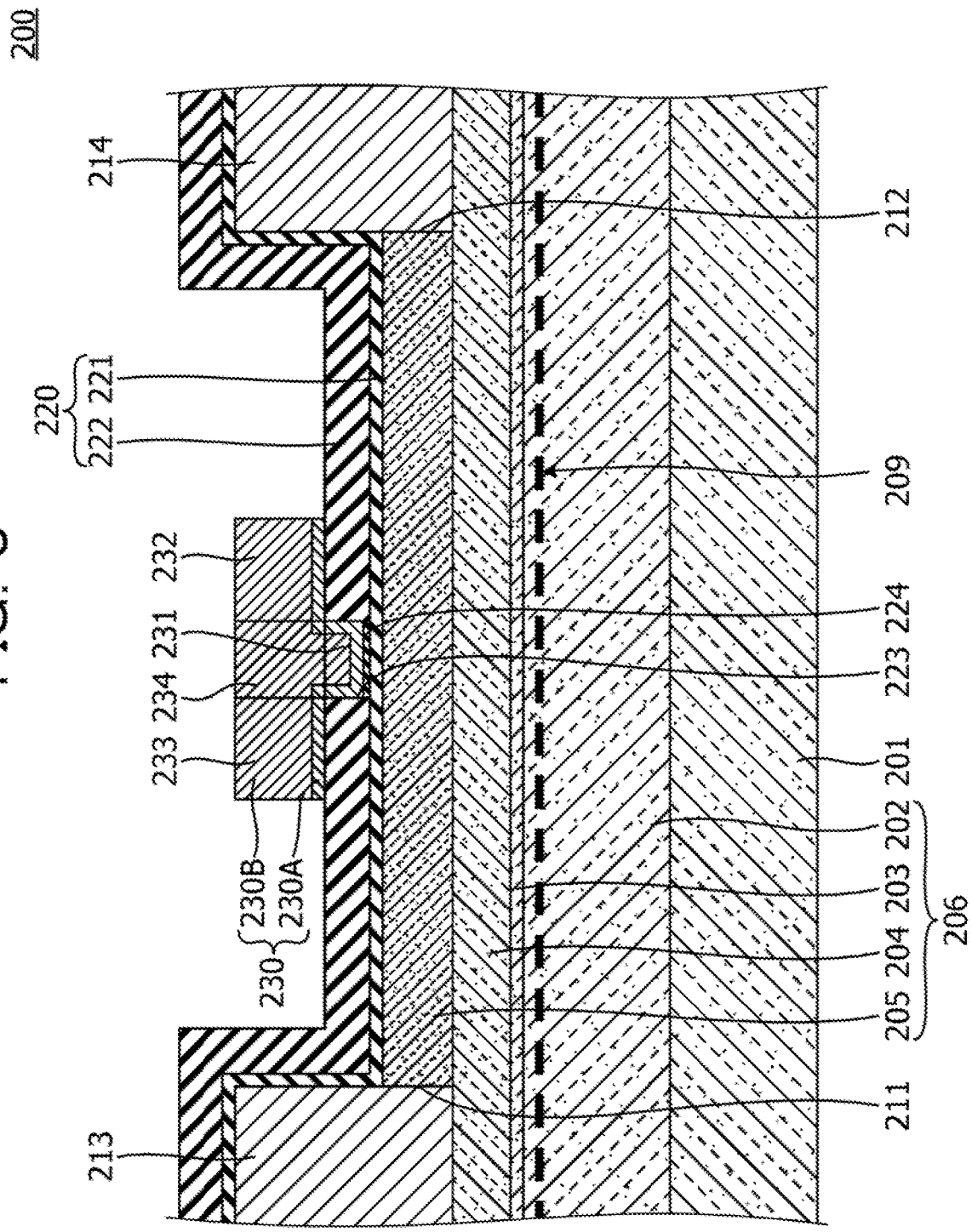

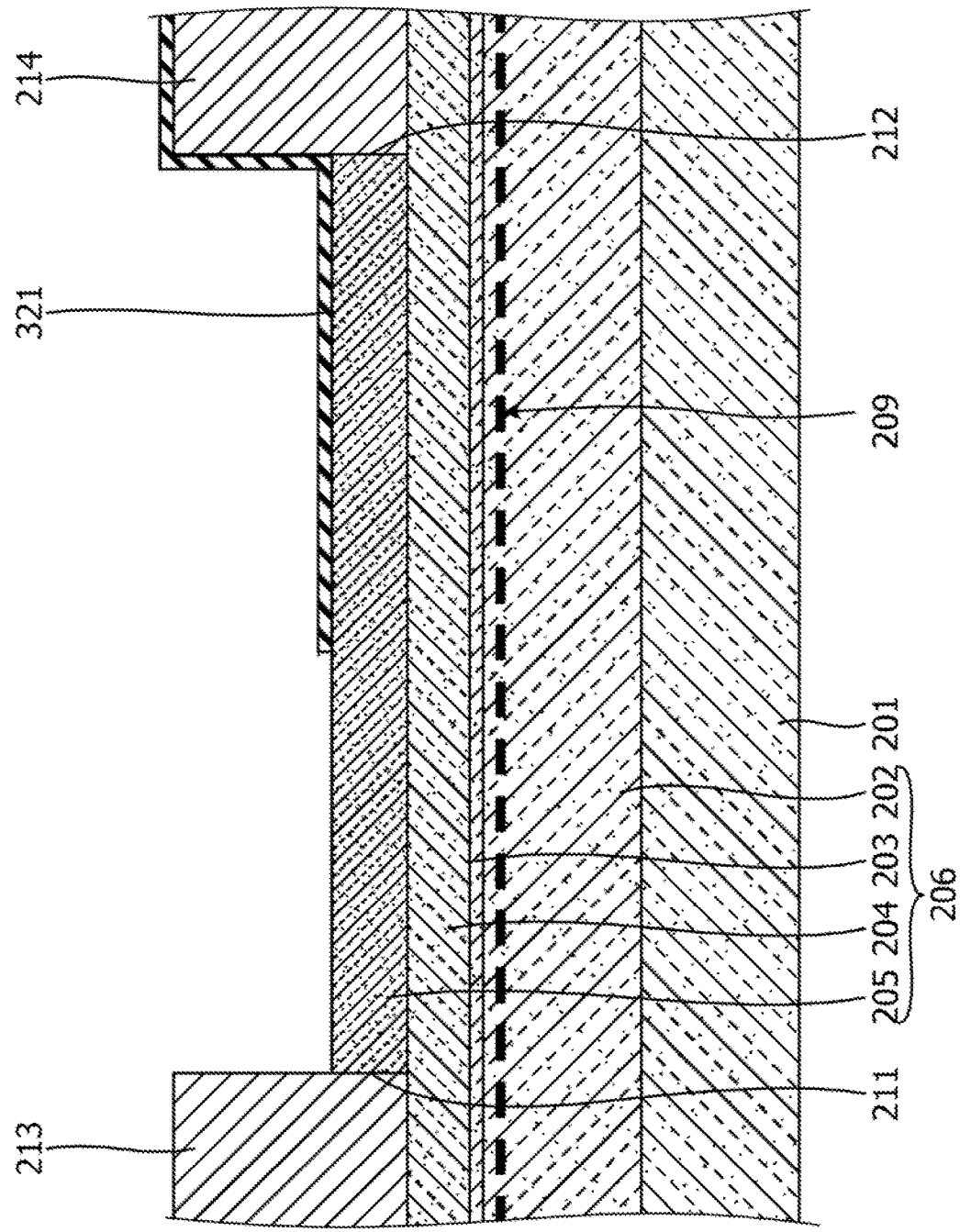

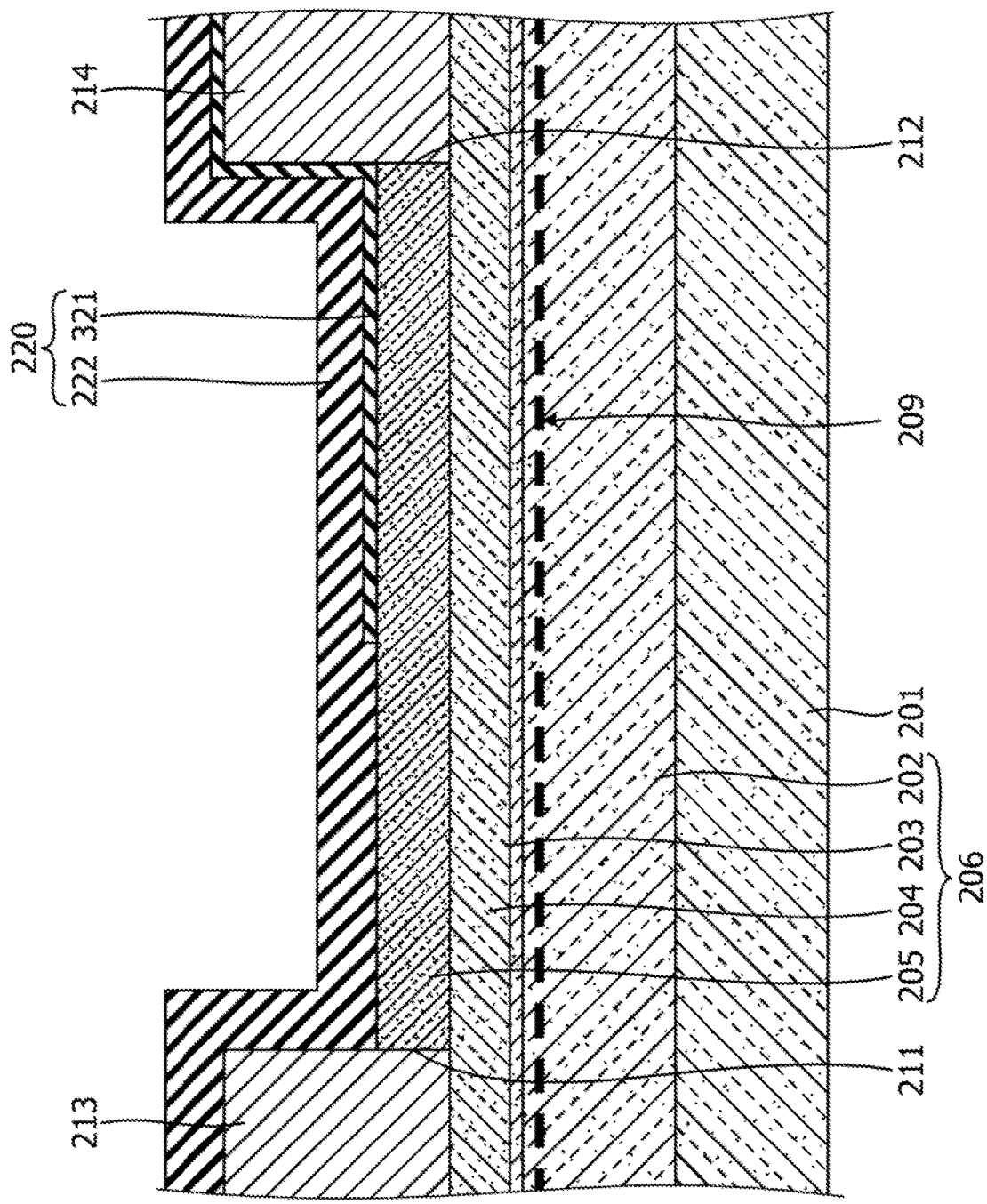

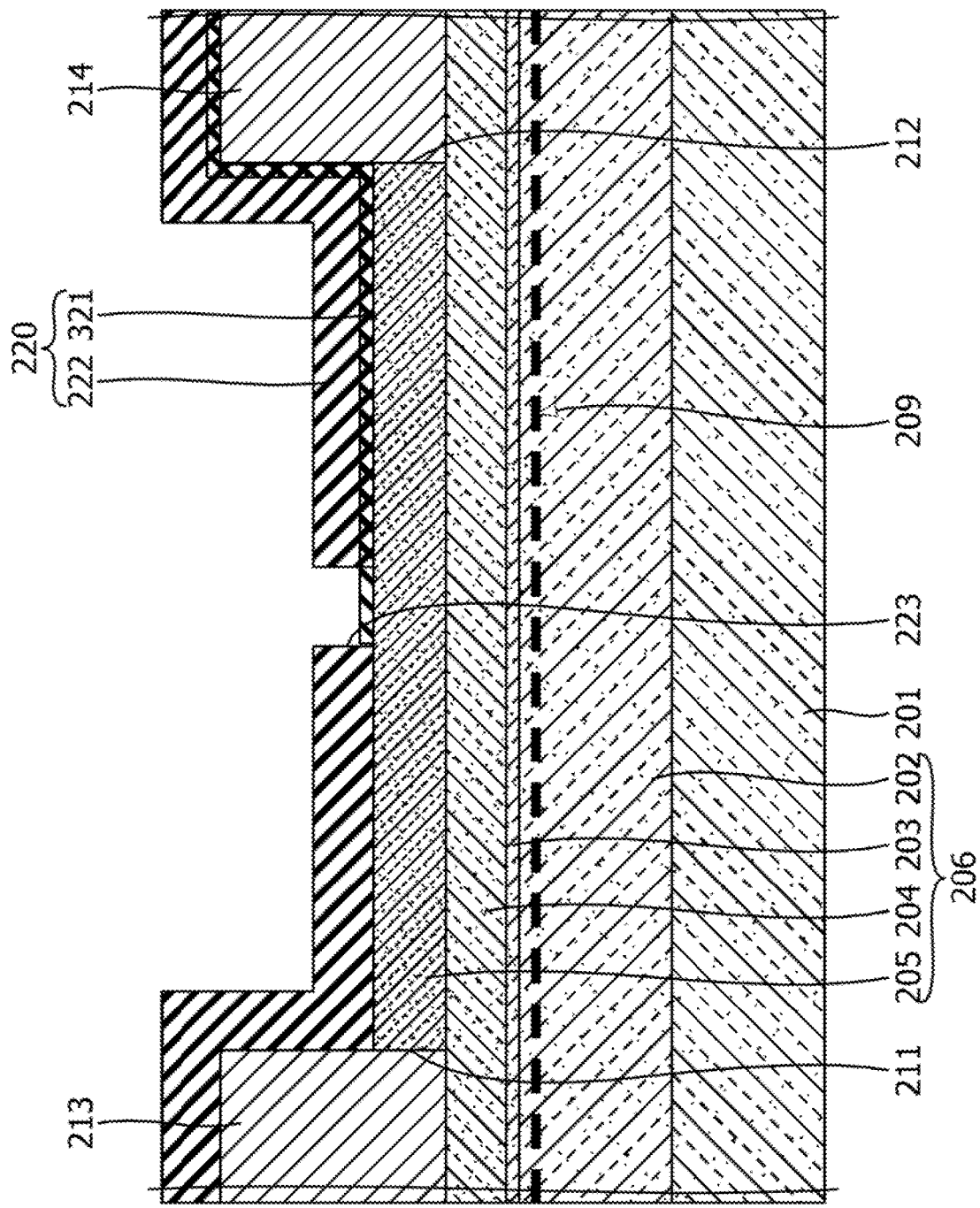

US 11,387,357 B2

COMPOUND SEMICONDUCTOR DEVICE, METHOD FOR MANUFACTURING THE SAME AND AMPLIFIER

CROSS-REFERENCE TO RELATED APPLICATION

This application is based upon and claims the benefit of priority of the prior Japanese Patent Application No. 2019-142479, filed on Aug. 1, 2019, the entire contents of which are incorporated herein by reference.

FIELD

The present disclosure relates to a compound semiconductor device and a method for manufacturing the same.

BACKGROUND

Nitride semiconductors have characteristics such as a high saturation electron velocity and a wide band gap. For this reason, various studies have been made to apply a nitride semiconductor to a semiconductor device having a high breakdown voltage and a high output by utilizing these characteristics. In recent years, for example, a technology related to a GaN-based high electron mobility transistor (HEMT) has been developed.

Related technologies are disclosed in, for example, Japanese Laid-open Patent Publication No. 2016-62976.

Related technologies are also disclosed in, for example, Japanese Laid-open Patent Publication No. 2015-56457.

SUMMARY

According to an aspect of the embodiments, a compound semiconductor device includes: a semiconductor laminate structure including an electron transit layer and an electron supply layer that are formed from a compound semiconductor; a gate electrode, a source electrode, and a drain electrode that are provided above the electron supply layer; and an insulating layer that is provided between the source electrode and the drain electrode, over the semiconductor laminate structure, and with a gate recess formed therein, wherein the gate electrode includes: a first portion in the gate recess; and a second portion that is coupled to the first portion and is provided over the insulating layer at a position further on the drain electrode side than the gate recess, wherein the insulating layer includes an aluminum oxide film in direct contact with the semiconductor laminate structure, wherein the aluminum oxide film is at least located between the second portion and the semiconductor laminate structure in a thickness direction of the insulating layer, and wherein, when a composition of the aluminum oxide film is expressed as $AlO_x$, a value of x is larger than 1.5.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2C is a third section view of the compound semiconductor device according to the first embodiment illustrating the manufacturing method thereof;

FIG. 5 is a section view of a compound semiconductor device according to a modification example of the second embodiment;

FIG. 7A is a first section view of the compound semiconductor device according to the third embodiment illustrating a manufacturing method thereof;

FIG. 7B is a second section view of the compound semiconductor device according to the third embodiment illustrating the manufacturing method thereof;

FIG. 7C is a third section view of the compound semiconductor device according to the third embodiment illustrating the manufacturing method thereof;

DESCRIPTION OF EMBODIMENTS

In an example of a GaN-based HEMT, GaN is used for an electron transit layer, AlGaN is used for an electron supply layer, and a two-dimensional electron gas (2DEG) of high concentration is generated in the electron transit layer as an effect of piezoelectric polarization and spontaneous polarization in GaN. Therefore, application for high-output amplifiers and high-efficiency switching devices is expected for GaN-based HEMTs. Further, a gate electrode including a field plate is sometimes used for the purpose of improving the breakdown voltage or the like.

Problems

In recent years, there has been an increasing demand for further reduction in gate leakage current of a compound semiconductor device including a gate electrode having a field plate.

A compound semiconductor device capable of further reducing the gate leakage current, and a method for manufacturing the same may be provided.

The inventors of the present application have made intensive studies to reduce the gate leakage current of a compound semiconductor device including a gate electrode having a field plate. As a result, it has become clear that a metal-insulator-semiconductor (MIS) structure is formed by the field plate, a semiconductor laminate structure including an electron transit layer and an electron supply layer, and an insulating layer therebetween, and the gate leakage current is larger when the threshold voltage in the MIS structure is deeper. In the MIS structure, a depletion layer may extend from the field plate to the insulating layer and the semiconductor laminate structure during pinch-off. The MIS structure also includes 2DEG. However, when the threshold voltage is deeper, the depletion layer is less likely to extend to the 2DEG, and the electric field applied to an end portion of the field plate on the drain electrode side is stronger. Therefore, the gate leakage current is larger when the threshold voltage is deeper. Based on such new findings, the inventors of the present application have further intensively studied to make the threshold voltage of the MIS structure shallower, and as a result, have arrived at the following embodiments of the present disclosure.

Hereinafter, embodiments of the present disclosure will be described in detail with reference to accompanying drawings. In the specification and drawings, constituent elements having substantially the same functional configuration may be denoted by the same reference signs and redundant description thereof may be omitted.

First Embodiment

Figure 1:
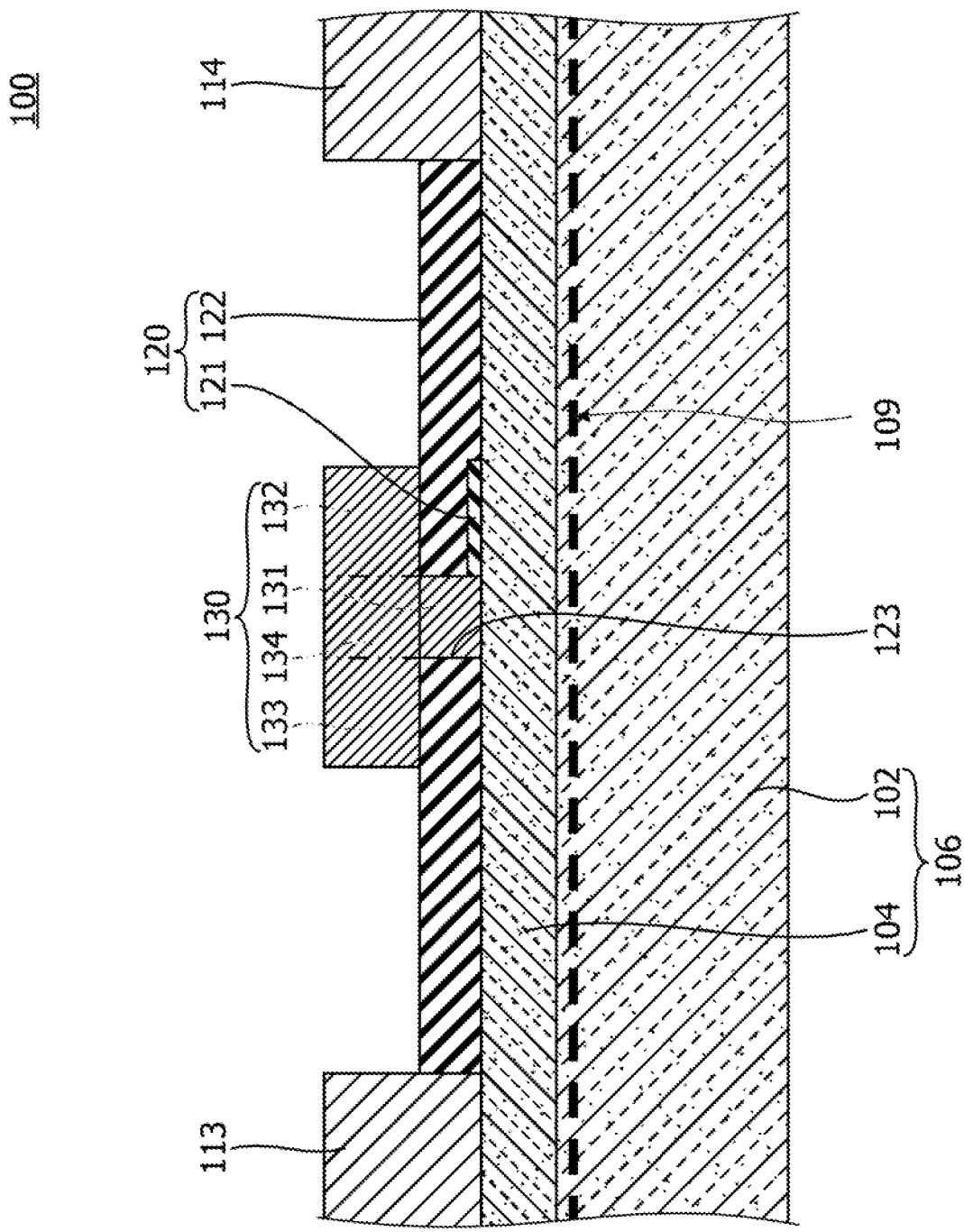
FIG. 1 is a section view of a compound semiconductor device according to a first embodiment.

First, a first embodiment is described. A first embodiment relates to a compound semiconductor device including a high electron mobility transistor (HEMT). FIG. 1 is a section view of the compound semiconductor device according to the first embodiment.

As illustrated in FIG. 1, a compound semiconductor device 100 according to the first embodiment includes a semiconductor laminate structure 106 including an electron transit layer 102 and an electron supply layer 104 that are formed from compound semiconductor. The compound semiconductor device 100 includes a gate electrode 130, a source electrode 113, and a drain electrode 114 above the electron supply layer 104. The compound semiconductor device 100 includes an insulating layer 120 provided over the semiconductor laminate structure 106 and between the source electrode 113 and the drain electrode 114 and having a gate recess 123 formed therein. The gate electrode 130 includes a first portion 131 in the gate recess 123 and a second portion 132 coupled to the first portion 131 and provided over the insulating layer 120 at a position further on the drain electrode 114 side than the gate recess 123. The gate electrode 130 may include a third portion 133 provided over the insulating layer 120 at a position further on the source electrode 113 side than the gate recess 123 and a fourth portion 134 over the first portion 131. The first portion 131, the second portion 132, and the third portion 133 are coupled to each other via the fourth portion 134. The insulating layer 120 includes an aluminum oxide film 121 in direct contact with the semiconductor laminate structure 106. The aluminum oxide film 121 is located at least between the second portion 132 and the semiconductor laminate structure 106 in the thickness direction of the insulating layer 120. When the composition of the aluminum oxide film 121 is represented by $AlO_{x1}$, the value of x1 is larger than 1.5. The insulating layer 120 may include a silicon nitride film 122 over the aluminum oxide film 121.

In the compound semiconductor device 100, 2DEG 109 is generated in the vicinity of the interface between the electron transit layer 102 and the electron supply layer 104 in the electron transit layer 102. Further, the second portion 132 functions as a field plate, and therefore an excellent breakdown voltage may be obtained. In the compound semiconductor device 100, at the time of pinch-off, a depletion layer spreads in a portion of the semiconductor laminate structure 106 below the first portion 131, and also a depletion layer spreads from the second portion 132 to the semiconductor laminate structure 106.

In the present embodiment, the aluminum oxide film 121 is in direct contact with a portion of the semiconductor laminate structure 106 below the second portion 132, and when the composition of the aluminum oxide film 121 is expressed as $AlO_{x1}$, the value of x1 is larger than 1.5. That is, the aluminum oxide film 121 contains Al vacancies. Therefore, negative charges derived from the Al vacancies are generated at the interface between the aluminum oxide film 121 and the semiconductor laminate structure 106. Therefore, the threshold voltage of a laminate structure of the second portion 132, the insulating layer 120, and the semiconductor laminate structure 106 is significantly shallower than that in the case where the silicon nitride film 122 instead of the aluminum oxide film 121 is in direct contact with the semiconductor laminate structure 106. According to the present embodiment, at the time of pinch-off, the depletion layer spreads from the second portion 132 to the 2DEG 109, electric field concentration at an end portion of the second portion 132 on the drain electrode 114 side is suppressed, and the gate leakage current is reduced.

Since the level of the Al vacancy is so deep as about 3 eV to 5 eV and the Al vacancy acts as a fixed charge, the negative charge derived from the Al vacancy does not adversely affect the actual operation of the compound semiconductor device 100.

Next, a method for manufacturing the compound semiconductor device 100 according to the first embodiment will be described. FIGS. 2A to 2D are each a section view of the compound semiconductor device 100 according to the first embodiment illustrating a manufacturing method thereof.

Figure 2A:
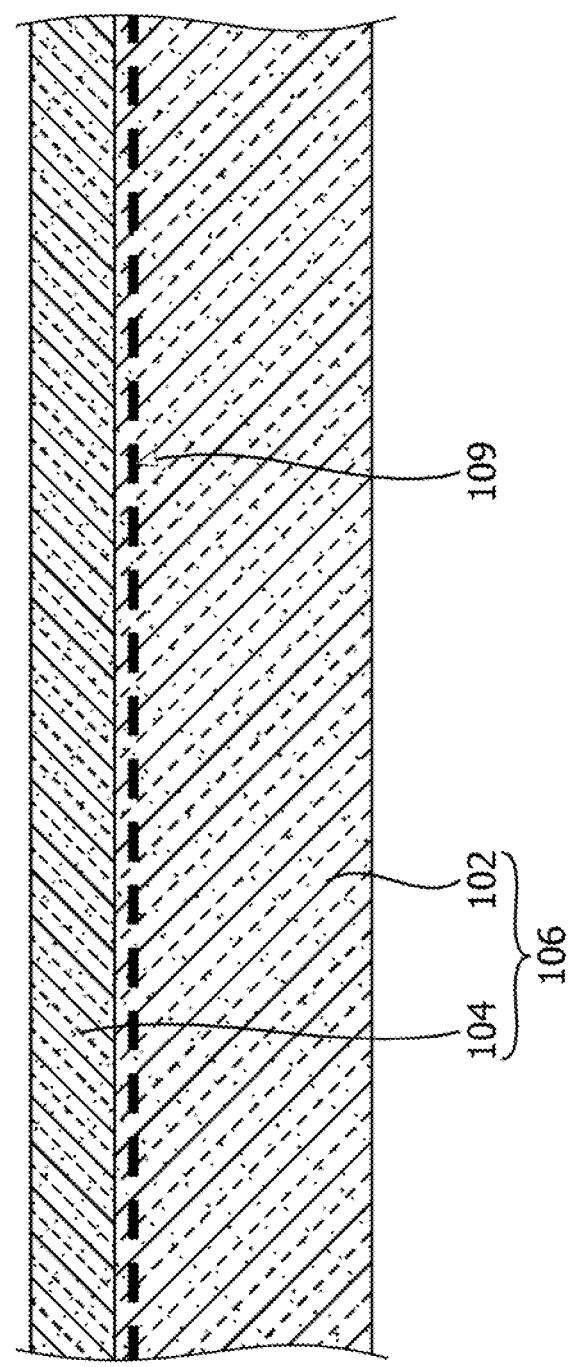
FIG. 2A is a first section view of the compound semiconductor device according to the first embodiment illustrating a manufacturing method thereof.
Figure 2B:
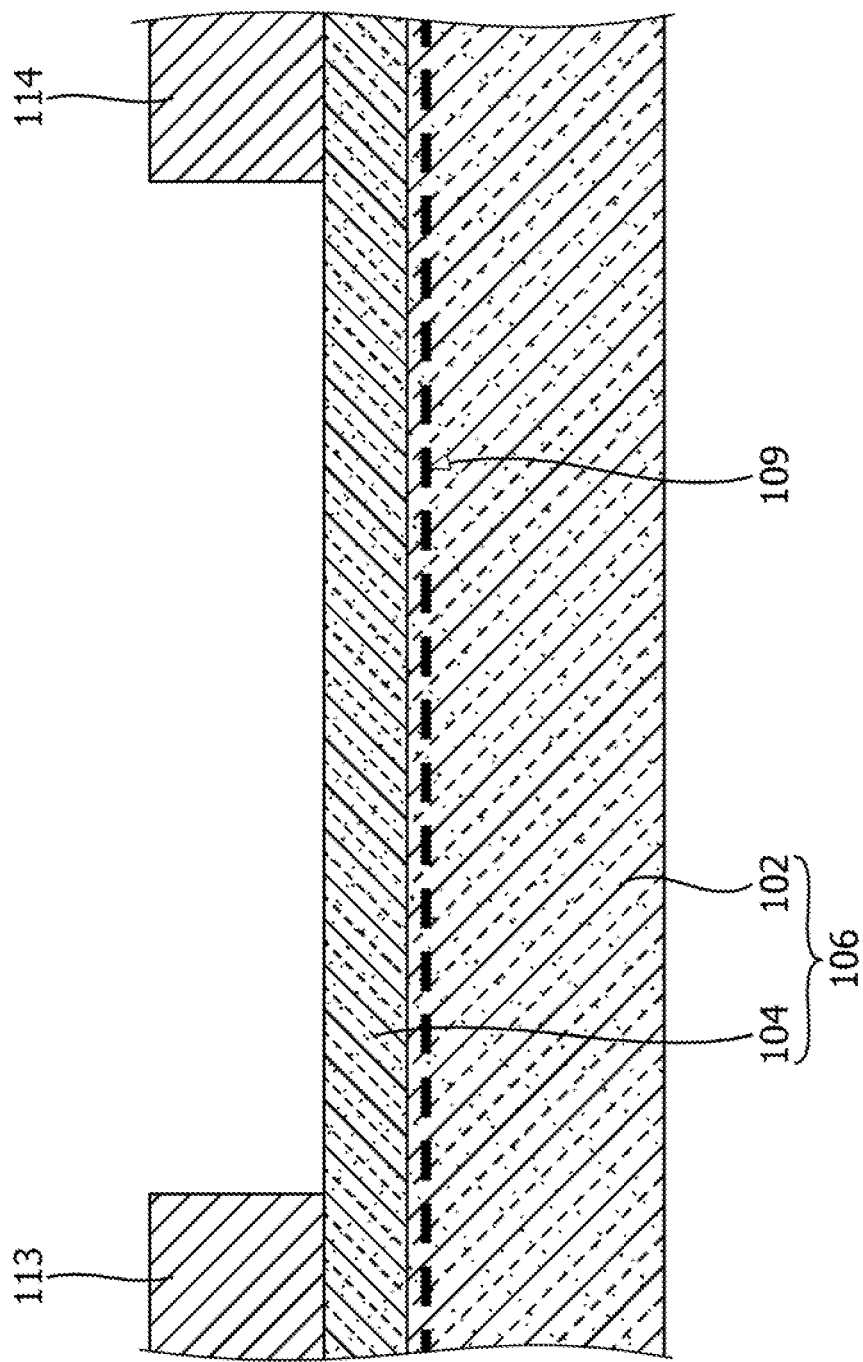
FIG. 2B is a second section view of the compound semiconductor device according to the first embodiment illustrating the manufacturing method thereof.
Figure 2D:
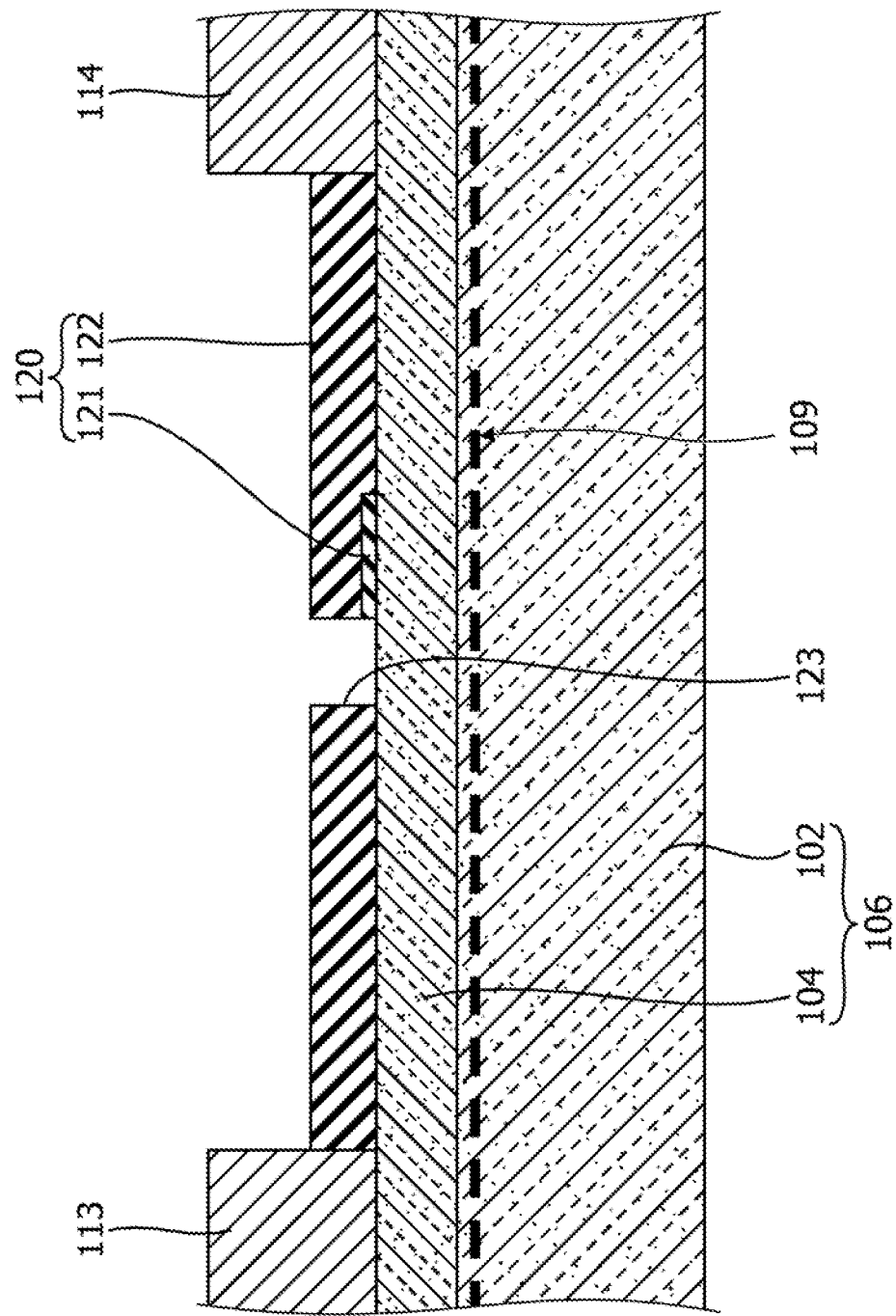
FIG. 2D is a fourth section view of the compound semiconductor device according to the first embodiment illustrating the manufacturing method thereof.

As illustrated in FIG. 2A, the semiconductor laminate structure 106 including the electron transit layer 102 and the electron supply layer 104 of compound semiconductor is formed. The 2DEG 109 is generated in the vicinity of the surface of the electron transit layer 102. As illustrated in FIG. 2B, the source electrode 113 and the drain electrode 114 are formed above the electron supply layer 104. As illustrated in FIG. 2C, the insulating layer 120 including the aluminum oxide film 121 and the silicon nitride film 122 is formed over the semiconductor laminate structure 106 and between the source electrode 113 and the drain electrode 114. The aluminum oxide film 121 is formed so as to be in direct contact with the semiconductor laminate structure 106. As illustrated in FIG. 2D, the gate recess 123 is formed in the insulating layer 120. The gate recess 123 is formed, for example, further on the source electrode 113 side than at least a part of the aluminum oxide film 121. Next, the gate electrode 130 including the first portion 131 in the gate recess 123 and the second portion 132 coupled to the first portion 131 and provided over the insulating layer 120 at a position further on the drain electrode 114 side than the gate recess 123 is formed (see FIG. 1). The gate electrode 130 may be formed to further include the third portion 133 provided over the insulating layer 120 at a position further on the source electrode 113 side than the gate recess 123 and the fourth portion 134 over the first portion 131.

In this manner, the compound semiconductor device 100 according to the first embodiment may be manufactured.

Second Embodiment

Figure 3:
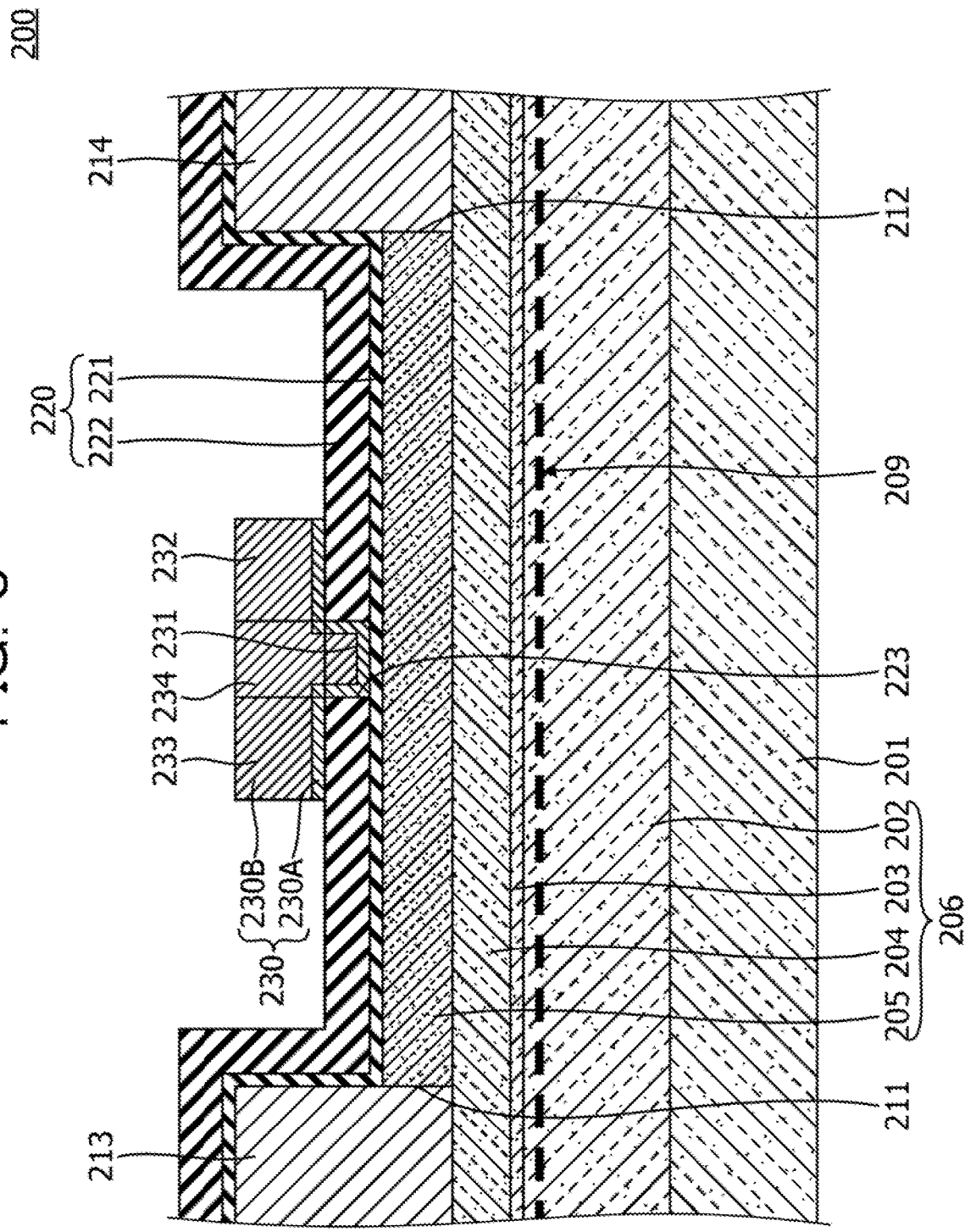
FIG. 3 is a section view of a compound semiconductor device according to a second embodiment.

Next, a second embodiment is described. The second embodiment relates to a compound semiconductor device including a GaN-based HEMT. FIG. 3 is a section view of a compound semiconductor device according to the second embodiment.

A compound semiconductor device 200 according to the second embodiment includes a semiconductor laminate structure 206 formed over a substrate 201 as illustrated in FIG. 3. The semiconductor laminate structure 206 includes, for example, an electron transit layer 202, a spacer layer 203, an electron supply layer 204, and a cap layer 205 that are formed from compound semiconductor. The electron transit layer 202 is, for example, a GaN layer (i-GaN layer) having a thickness of 2 μm to 4 μm and not having undergone intentional doping with impurities. The spacer layer 203 is, for example, an AlGaN layer (i-AlGaN layer) having a thickness of 4 nm to 6 nm and not having undergone intentional doping with impurities. The electron supply layer 204 is, for example, an n-type AlGaN layer (n-AlGaN layer) having a thickness of 25 nm to 35 nm. The cap layer 205 is, for example, a GaN layer having a thickness of 1 nm to 10 nm. The electron supply layer 204 is, for example, doped with Si at a concentration of about $5 \times 10^{18}$ cm$^{-3}$. The semiconductor laminate structure 206 may include a buffer layer of AlGaN or the like between the electron transit layer 202 and the substrate 201.

Opening portions 211 and 212 are defined in the cap layer 205. A source electrode 213 is formed in the opening portion 211, and a drain electrode 214 is formed in the opening portion 212. An insulating layer 220 is formed over the cap layer 205. The insulating layer 220 may cover a side surface and an upper surface of the source electrode 213, and may cover a side surface and an upper surface of the drain electrode 214. The insulating layer 220 includes an aluminum oxide film 221 in direct contact with the semiconductor laminate structure 206, and a silicon nitride film 222 over the aluminum oxide film 221. The aluminum oxide film 221 is located at least between the second portion 232 and the semiconductor laminate structure 206 in the thickness direction of the insulating layer 220. In the compound semiconductor device 200, the aluminum oxide film 221 covers an upper surface of the cap layer 205, a side surface and the upper surface of the source electrode 213, and a side surface and the upper surface of the drain electrode 214. When the composition of the aluminum oxide film 221 is expressed as AlO$_{x2}$, the value of x2 is larger than 1.5. The thickness of the aluminum oxide film 221 is, for example, about 0.5 nm to 10 nm. The thickness of the silicon nitride film 222 is, for example, about 10 nm to 100 nm. A gate recess 223 is formed in the insulating layer 220. The gate recess 223 is formed between the source electrode 213 and the drain electrode 214. The source electrode 213 and the drain electrode 214 are formed from, for example, metal, and may include a laminate of a titanium (Ti) film and an aluminum (Al) film thereover.

The compound semiconductor device 200 includes a gate electrode 230. The gate electrode 230 includes a first portion 231 in the gate recess 223 and a second portion 232 coupled to the first portion 231 and provided over the insulating layer 220 at a position further on the drain electrode 214 side than the gate recess 223. The gate electrode 230 includes a third portion 233 provided over the insulating layer 220 at a position further on the source electrode 213 side than the gate recess 223 and a fourth portion 234 over the first portion 231. The first portion 231, the second portion 232, and the third portion 233 are coupled to each other via the fourth portion 234. The gate electrode 230 has a so-called T-shaped structure. The aluminum oxide film 221 is present between the first portion 231 and the cap layer 205. The gate electrode 230 is made of, for example, metal, and may include a laminate of a nickel (Ni) film 230A and a gold (Au) film 230B thereover. The Ni film 230A included in the first portion 231 may be in direct contact with the silicon nitride film 222.

In the compound semiconductor device 200, 2DEG 209 is generated in the vicinity of the interface between the electron transit layer 202 and the electron supply layer 204 in the electron transit layer 202. Further, since the second portion 232 functions as a field plate, an excellent breakdown voltage may be obtained. In the compound semiconductor device 200, at the time of pinch-off, a depletion layer spreads in a portion the semiconductor laminate structure 206 below the first portion 231, and also a depletion layer spreads from the second portion 232 to the semiconductor laminate structure 206.

In the present embodiment, the aluminum oxide film 221 is in direct contact with a portion of the semiconductor laminate structure 206 below the second portion 232, and when the composition of the aluminum oxide film 221 is expressed as AlO$_{x2}$, the value of x2 is larger than 1.5. That is, the aluminum oxide film 221 contains Al vacancies. Therefore, negative charges derived from the Al vacancies are generated at the interface between the aluminum oxide film 221 and the semiconductor laminate structure 206. Therefore, the threshold voltage of the MIS structure of the second portion 232, the insulating layer 220, and the semiconductor laminate structure 206 is significantly shallower than that in the case where the silicon nitride film 222 instead of the aluminum oxide film 221 is in direct contact with the semiconductor laminate structure 206. According to the present embodiment, at the time of pinch-off, the depletion layer spreads from the second portion 232 to the 2DEG 209, electric field concentration at an end portion of the second portion 232 on the drain electrode 214 side is suppressed, and the gate leakage current is reduced.

Since the level of the Al vacancy is so deep as about 3 eV to 5 eV and the Al vacancy acts as a fixed charge, the negative charge derived from the Al vacancy does not adversely affect the actual operation of the compound semiconductor device 200.

Nickel silicide (NiSi) may be generated from Ni contained in the gate electrode 230 and Si contained in the silicon nitride film 222. In the compound semiconductor device 200, since the aluminum oxide film 221 is present between the first portion 231 and the cap layer 205, even when nickel silicide is generated, the gate leakage current passing through the nickel silicide may be reduced.

The thickness of the aluminum oxide film 221 is not limited, but is preferably 5 nm or less. This is because if the thickness of the aluminum oxide film 221 exceeds 5 nm, the mutual conductance (gm) may deteriorate.

Next, a method for manufacturing the compound semiconductor device 200 according to the second embodiment will be described. FIGS. 4A to 4E are each a section view of the compound semiconductor device 200 according to the second embodiment illustrating a manufacturing method thereof.

Figure 4A:
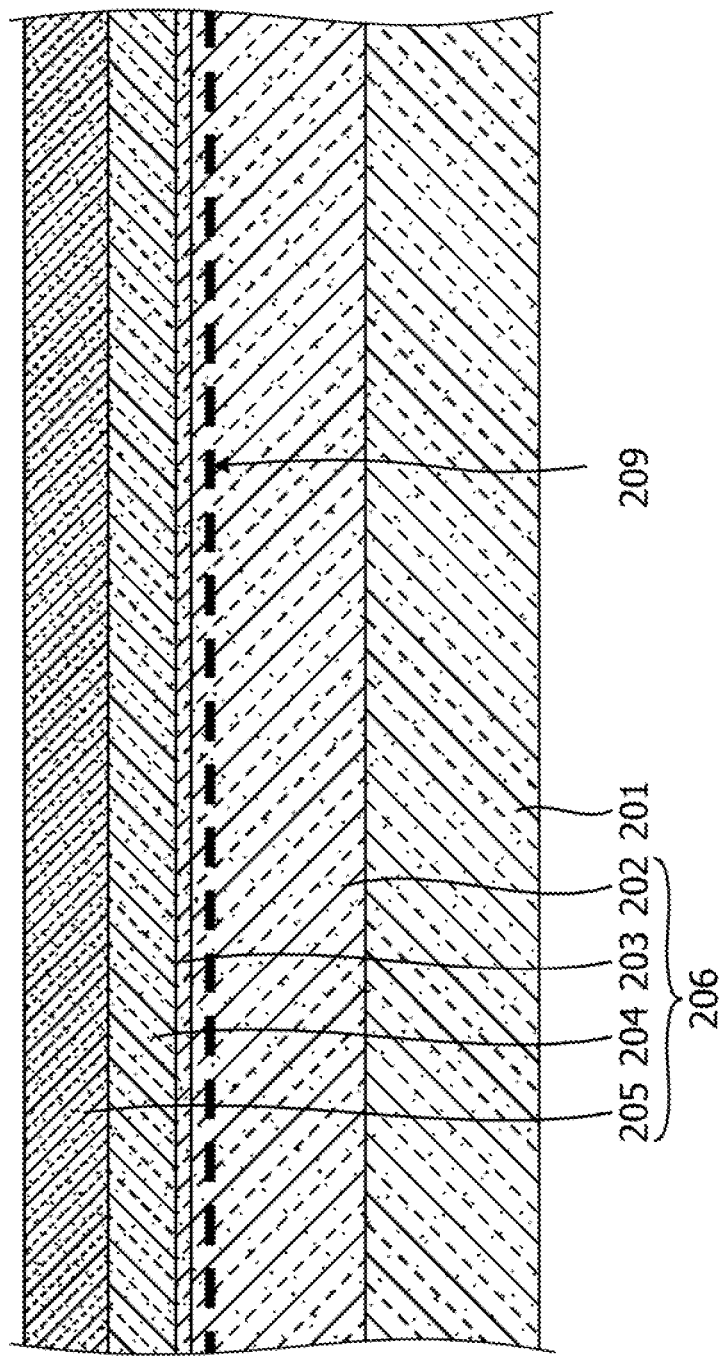
FIG. 4A is a first section view of the compound semiconductor device according to the second embodiment illustrating a manufacturing method thereof.

First, as illustrated in FIG. 4A, the semiconductor laminate structure 206 including the electron transit layer 202, the spacer layer 203, the electron supply layer 204, and the cap layer 205 is formed over the substrate 201. The semiconductor laminate structure 206 may be formed by, for example, the metal organic vapor phase epitaxy (MOVPE) method. As a result, the 2DEG 209 is generated in the vicinity of the surface of the electron transit layer 202.

For the formation of the semiconductor laminate structure 206, for example, a mixed gas of trimethylaluminum (TMA) gas serving as an Al source, a trimethylgallium (TMG) gas serving as a Ga source, and an ammonia ($NH_3$) gas serving as a N source is used. At this time, whether or not to supply the trimethylaluminum gas and the trimethylgallium gas and the flow amount thereof are appropriately set in accordance with the composition of the compound semiconductor layer to be grown. The flow amount of the ammonia gas that is a raw material common for each compound semiconductor layer is, for example, about 100 ccm to 10 LM. For example, the growth pressure is about 50 Torr to 300 Torr, and the growth temperature is about 1000° C. to 1200° C. When growing an n-type compound semiconductor layer (for example, the electron supply layer 204), for example, a $SiH_4$ gas containing Si is added to the mixed gas at a predetermined flow amount, and thus the compound semiconductor layer is doped with Si. The doping concentration of Si is, for example, about $1 \times 10^{18}$ $cm^{-3}$ to $1 \times 10^{20}$ $cm^{-3}$.

Figure 4B:
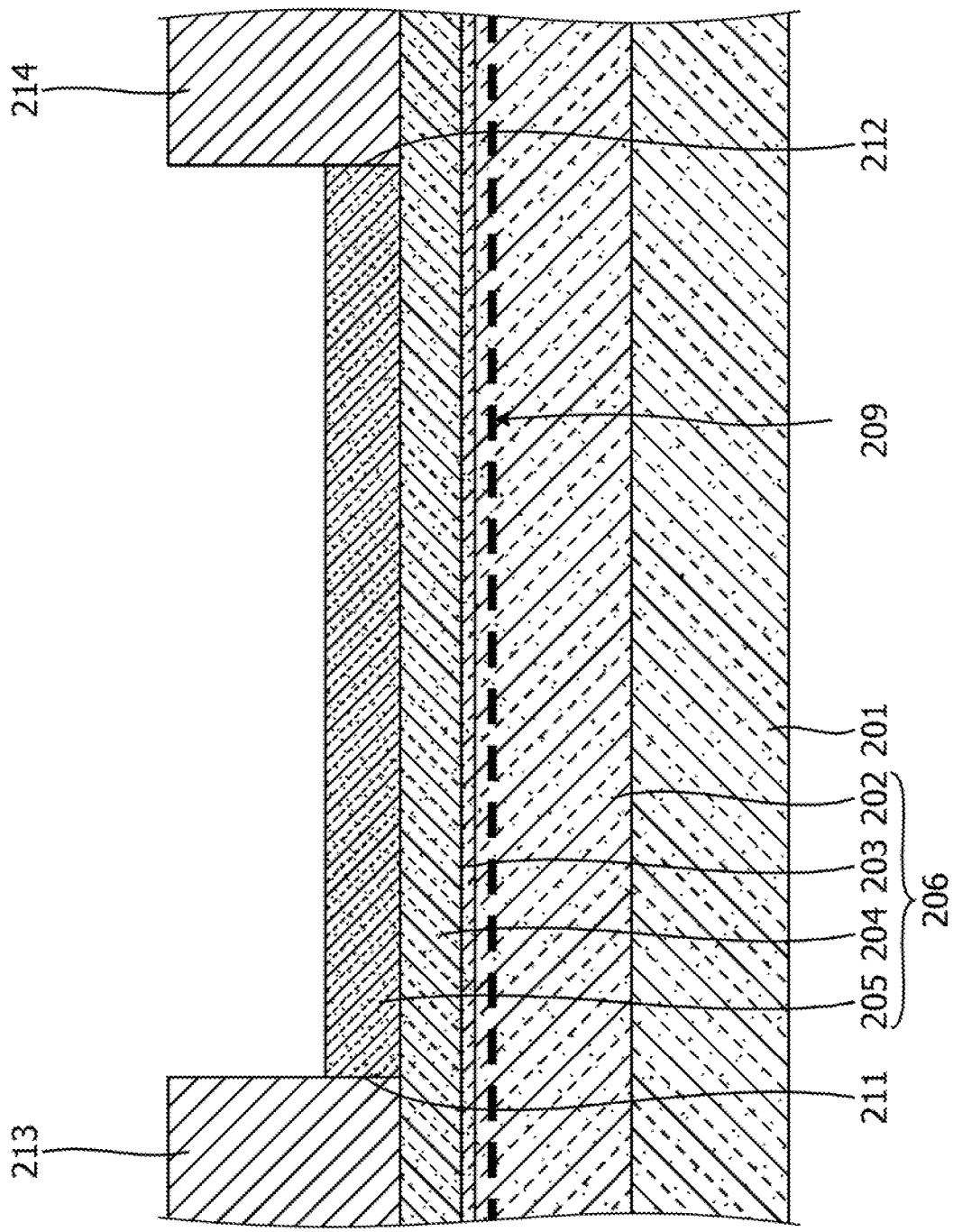
FIG. 4B is a second section view of the compound semiconductor device according to the second embodiment illustrating the manufacturing method thereof.

Then, as illustrated in FIG. 4B, the opening portions 211 and 212 are defined in the cap layer 205, the source electrode 213 is formed in the opening portion 211, and the drain electrode 214 is formed in the opening portion 212. For example, the opening portions 211 and 212 may be defined by providing, by photolithography technology, a resist film having opening portions respectively in regions where the source electrode 213 and the drain electrode 214 are to be formed, and performing dry etching by using a chlorine-based gas. Further, for example, the source electrode 213 and the drain electrode 214 may be formed inside the opening portions of the resist film by forming a metal film by a vapor deposition method using this resist film as a growth mask and removing the resist film together with the metal film thereon. That is, the source electrode 213 and the drain electrode 214 may be formed by a lift-off method. In the formation of the metal film, for example, an Al film is formed after forming a Ti film. After removing the resist film, for example, heat treatment is performed at 400° C. to 1000° C. in a nitrogen atmosphere to establish the ohmic characteristics.

Before the opening portions 211 and 212 are formed, an element separation region defining element regions may be formed in the semiconductor laminate structure 206. In the formation of the element separation region, for example, a photoresist pattern that exposes a region where the element separation region is to be formed is formed over the cap layer 205, and ion injection of Ar or the like is performed by using this pattern as a mask. Dry etching may be performed with a chlorine-based gas by using this pattern as an etching mask. The 2DEG 209 is not present in the element separation region.

Figure 4C:
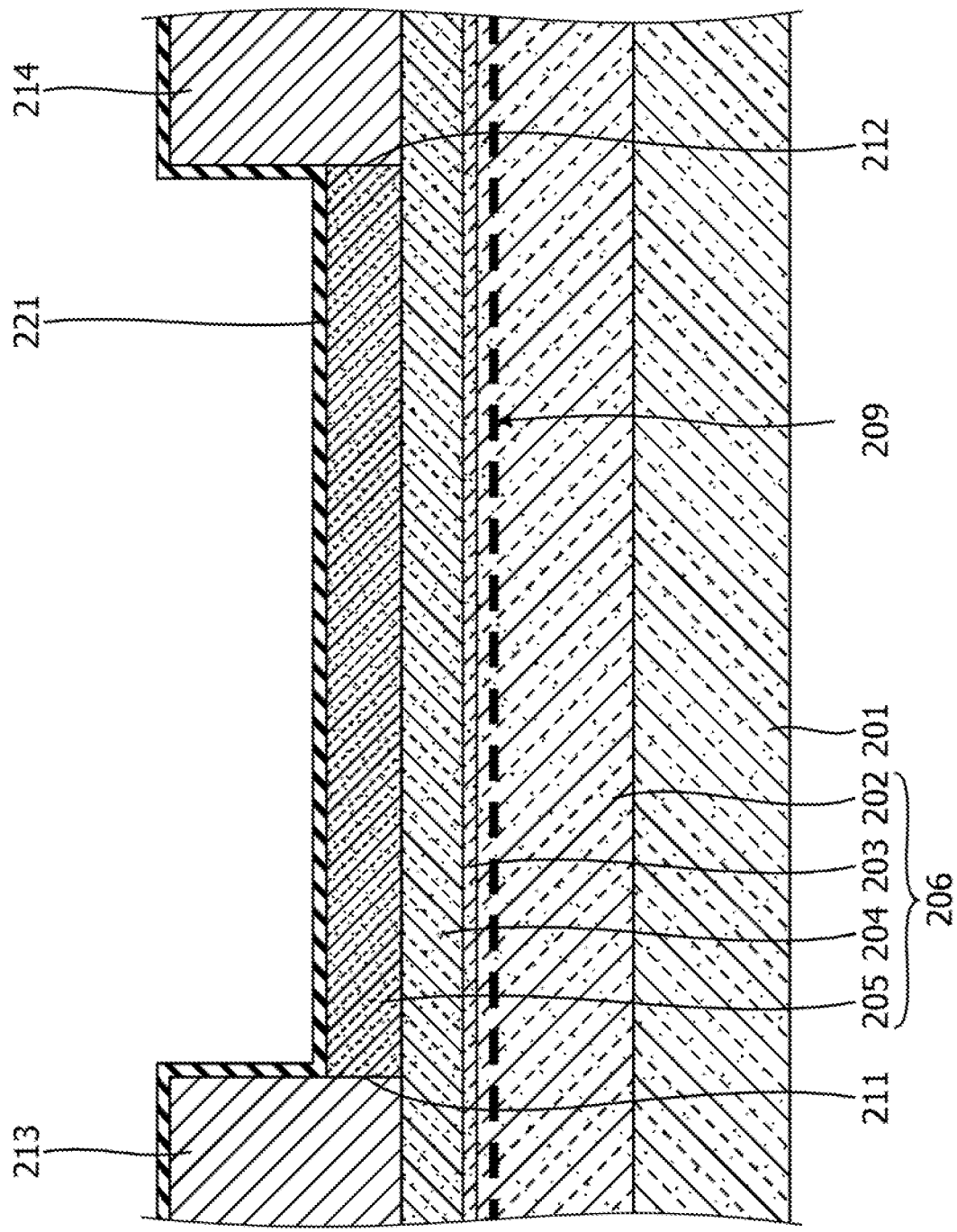
FIG. 4C is a third section view of the compound semiconductor device according to the second embodiment illustrating the manufacturing method thereof.

After the formation of the source electrode 213 and the drain electrode 214, the aluminum oxide film 221 covering an upper surface of the cap layer 205, a side surface and the upper surface of the source electrode 213, and a side surface and the upper surface of the drain electrode 214 is formed as illustrated in FIG. 4C. When the composition of the aluminum oxide film 221 is expressed as $AlO_{x2}$, the value of x2 is larger than 1.5. In the formation of the aluminum oxide film 221, for example, an aluminum oxide film is formed by an atomic layer deposition (ALD) method, and then the aluminum oxide film is subjected to heat treatment in an oxidizing atmosphere. The aluminum oxide film formed by the ALD method has an Al-rich composition. For example, when the composition of the aluminum oxide film is expressed as $AlO_y$, the value of y is less than 1.5. As a result of the subsequent heat treatment in the oxidizing atmosphere, the aluminum oxide film 221 having an oxygen-rich composition may be obtained. In the formation of an aluminum oxide film by the ALD method, oxygen plasma or ozone is preferably used as an oxygen source. This is because the aluminum oxide film 221 having an oxygen-rich composition is easily obtained by the subsequent heat treatment. The oxygen plasma may contain active oxygen such as oxygen radicals or oxygen ions. The atmosphere for the heat treatment is preferably an atmosphere containing, for example, water vapor, oxygen, carbon dioxide, carbon monoxide, nitrogen dioxide, nitrogen monoxide, or any combination of these. For example, the heat treatment may be performed in an atmosphere containing water vapor and oxygen. The temperature of the heat treatment is, for example, preferably in the range of 100° C. to 750° C., and more preferably in the range of 250° C. to 350° C. The time of the heat treatment may be, for example, 30 minutes to 2 hours.

Figure 4D:
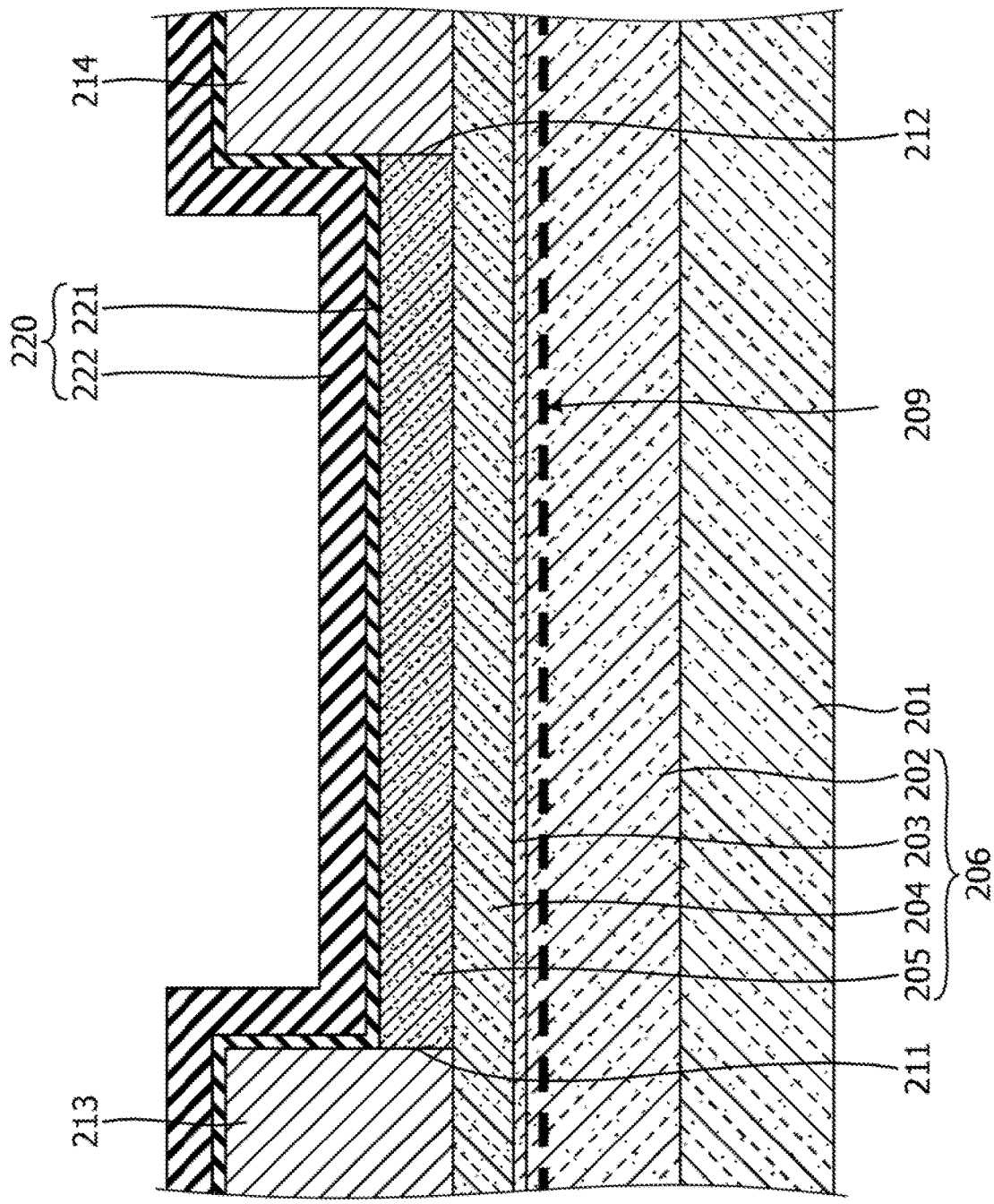
FIG. 4D is a fourth section view of the compound semiconductor device according to the second embodiment illustrating the manufacturing method thereof.

After the aluminum oxide film 221 is formed, the silicon nitride film 222 is formed over the aluminum oxide film 221 as illustrated in FIG. 4D. The silicon nitride film 222 may be formed by, for example, a plasma chemical vapor deposition (CVD) method. The aluminum oxide film 221 and the silicon nitride film 222 are included in the insulating layer 220.

Figure 4E:
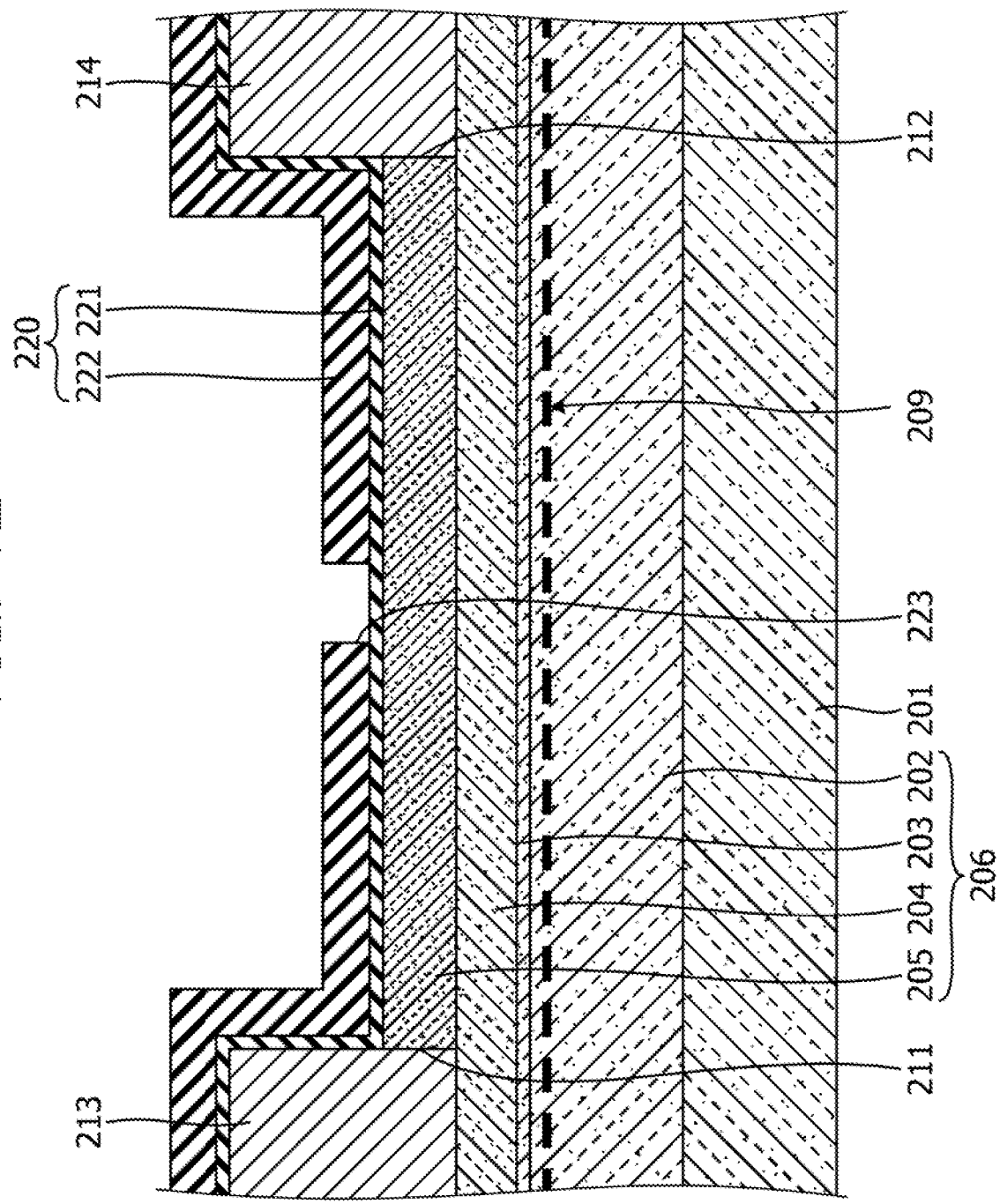
FIG. 4E is a fifth section view of the compound semiconductor device according to the second embodiment illustrating the manufacturing method thereof.

Next, as illustrated in FIG. 4E, a gate recess 223 is formed in the insulating layer 220. For example, the gate recess 223 may be formed by providing, by photolithography technology, a resist film including an opening portion in a region where the first portion 231 is to be formed and by performing dry etching by using a fluorine-based gas. In this dry etching, the silicon nitride film 222 is removed, but the aluminum oxide film 221 remains.

After that, the gate electrode 230 including the first portion 231, the second portion 232, the third portion 233, and the fourth portion 234 is formed (see FIG. 3). In the formation of the gate electrode 230, for example, a resist film having an opening portion in a region where the gate electrode 230 is to be formed is provided by photolithography technology. Then, the gate electrode 230 may be formed inside the opening portion of the resist film by forming a metal film by a vapor deposition method using this resist film as a growth mask and removing the resist film together with the metal film thereon. That is, the gate electrode 230 may be formed by a lift-off method. In the formation of the metal film, for example, an Au film is formed after forming an Ni film.

In this manner, the compound semiconductor device 200 according to the second embodiment may be manufactured.

When the gate recess 223 is formed by dry etching using a fluorine-based gas, an aluminum fluoride film is sometimes formed over the upper surface of the aluminum oxide film 221, and the aluminum fluoride film may be included in the compound semiconductor device 200. For example, as illustrated in FIG. 5, an aluminum fluoride film 224 may be provided between the first portion 231 and the aluminum oxide film 221. The aluminum fluoride film 224 may contain, for example, crystalline $AlF_3$ as a main component.

Third Embodiment

Figure 6:
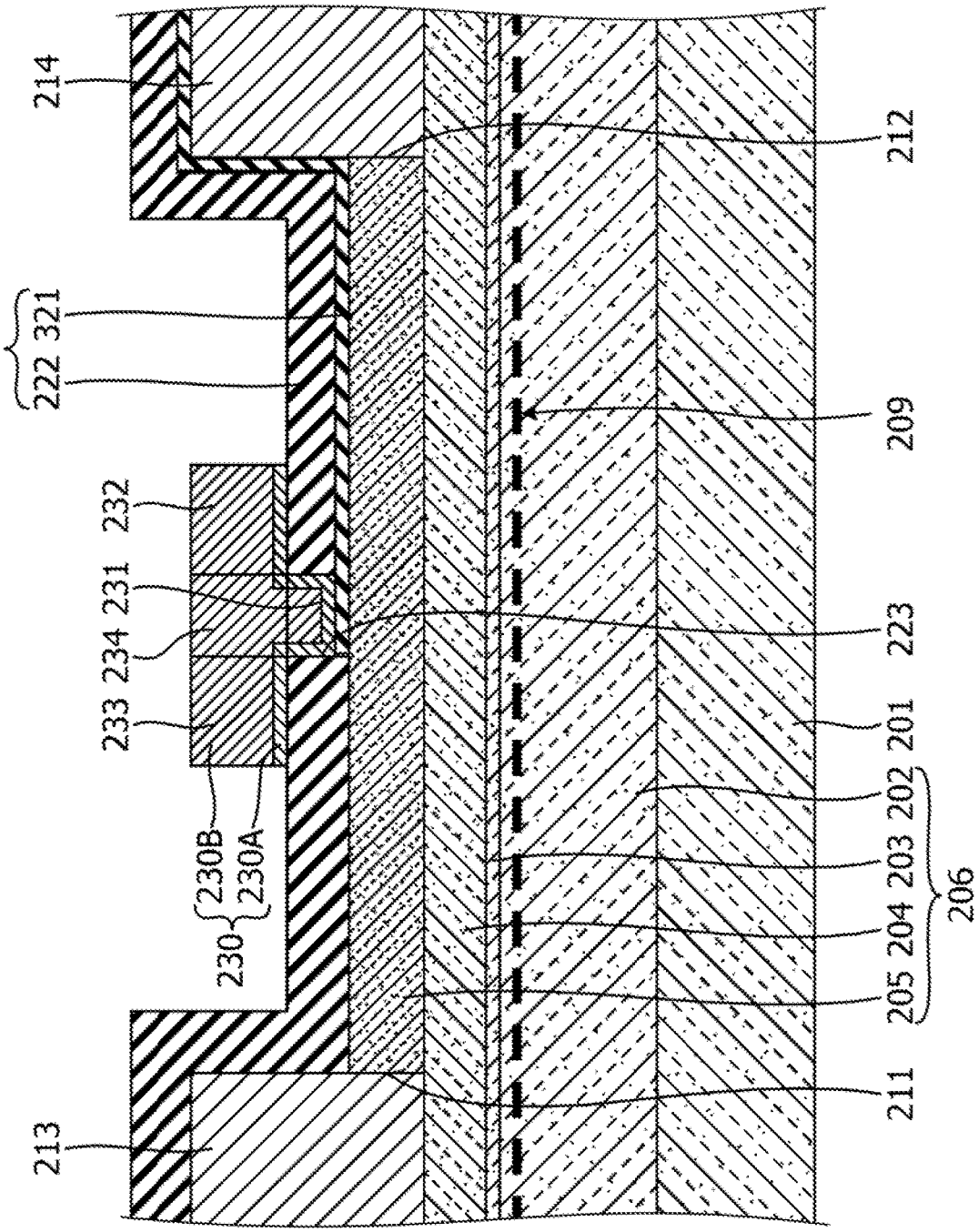
FIG. 6 is a section view of a compound semiconductor device according to a third embodiment.

Next, a third embodiment is described. The third embodiment relates to a compound semiconductor device including a GaN-based HEMT, and is different from the second embodiment in the configuration of the aluminum oxide film. FIG. 6 is a section view of the compound semiconductor device according to the third embodiment.

The compound semiconductor device 300 according to the third embodiment includes an aluminum oxide film 321 instead of the aluminum oxide film 221 of the second embodiment as illustrated in FIG. 6. The aluminum oxide film 321 is located at least between the second portion 232 and the semiconductor laminate structure 206 in the thickness direction of the insulating layer 220. The aluminum oxide film 321 is also present between the first portion 231 and the cap layer 205. In the compound semiconductor device 300, the aluminum oxide film 321 covers a part of the upper surface of the cap layer 205 and a side surface and the upper surface of the drain electrode 214. A portion of the upper surface of the cap layer 205 between the first portion 231 and the source electrode 213 is exposed from the aluminum oxide film 321. When the composition of the aluminum oxide film 321 is expressed as $AlO_{x3}$, the value of x3 is larger than 1.5. The thickness of the aluminum oxide film 321 is, for example, about 0.5 nm to 10 nm. The silicon nitride film 222 is provided over the aluminum oxide film 321 and covers a portion of the upper surface of the cap layer 205 between the first portion 231 and the source electrode 213. The silicon nitride film 222 also covers a side surface and the upper surface of the source electrode 213. The other configurations are the same as in the second embodiment.

According to the third embodiment, the same effects as those of the second embodiment may be obtained.

Next, a method for manufacturing the compound semiconductor device 300 according to the third embodiment will be described. FIGS. 7A to 7C are each a section view of the compound semiconductor device 300 according to the third embodiment illustrating a manufacturing method thereof.

First, as in the second embodiment, the processes up to the formation of the aluminum oxide film 221 and the heat treatment are performed (see FIG. 4C). Next, as illustrated in FIG. 7A, a part of the aluminum oxide film 221 is removed. For example, a portion of the aluminum oxide film 221 between the region where the first portion 231 is to be formed and the source electrode 213 and a portion covering the side surface and the upper surface of the source electrode 213 are removed. As a result, the aluminum oxide film 321 is formed. In the removal of the portions of the aluminum oxide film 221 described above, for example, wet etching using tetramethylammonium hydroxide (TMAH) is performed.

Thereafter, as illustrated in FIG. 7B, the silicon nitride film 222 is formed in the same manner as in the second embodiment. The silicon nitride film 222 is formed over the aluminum oxide film 321 so as to cover a portion of the upper surface of the cap layer 205 exposed from the aluminum oxide film 321 and further cover a side surface and the upper surface of the source electrode 213.

Next, as illustrated in FIG. 7C, the gate recess 223 is formed in the insulating layer 220. The gate recess 223 may be formed in the same manner as in the second embodiment.

Next, the gate electrode 230 including the first portion 231, the second portion 232, the third portion 233, and the fourth portion 234 is formed (see FIG. 6).

In this manner, the compound semiconductor device 300 according to the third embodiment may be manufactured.

As in the second embodiment, an aluminum fluoride film may be provided between the first portion 231 and the aluminum oxide film 321. This aluminum fluoride film may contain, for example, crystalline $AlF_3$ as a main component.

Here, experiments that the inventors of the present application conducted will be described. In this experiment, three compound semiconductor devices having different configurations were prepared. One compound semiconductor device had a configuration A corresponding to the second embodiment. The configuration A included an aluminum oxide film as in the second embodiment, and when the composition of the aluminum oxide film was expressed as $AlO_{x11}$, the value of x11 was 1.57. Another compound semiconductor device had a configuration B similar to the second embodiment. Configuration B included an aluminum oxide film, but when the composition of the aluminum oxide film was expressed as $AlO_{x12}$, the value of x12 was 1.38. Yet another compound semiconductor device had a configuration C obtained by removing the aluminum oxide film from the second embodiment. In the configuration C, the aluminum oxide film was not included, and the silicon nitride film was in direct contact with the cap layer below the second portion (field plate) of the gate electrode.

Figure 8:
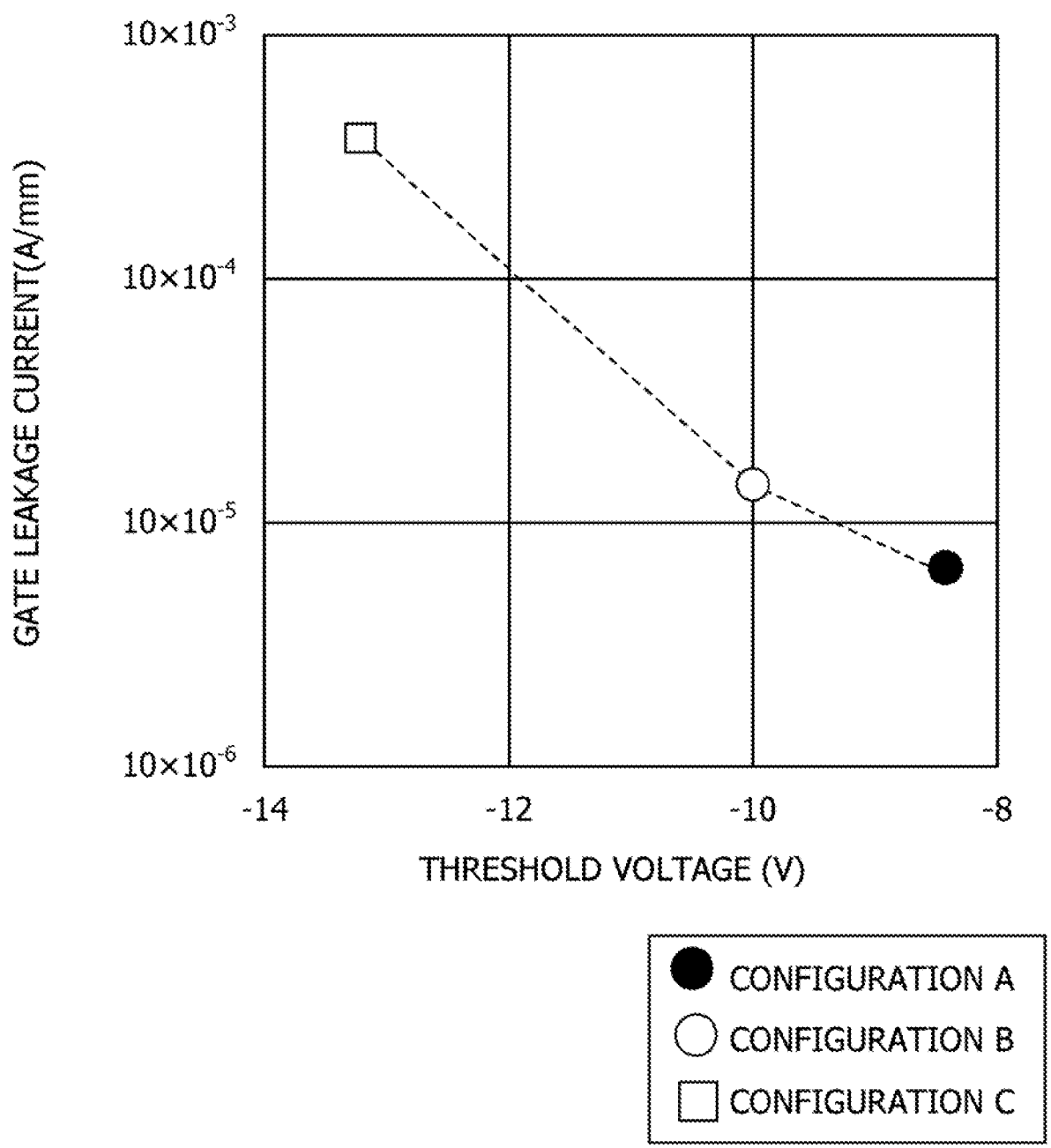
FIG. 8 is a diagram illustrating measurement results of threshold voltage and gate leakage current.

Then, for each of the configuration A, the configuration B, and the configuration C, the threshold voltage of the MIS structure including the second portion, the insulating layer, and the semiconductor laminate structure, and the gate leakage current at 150° C. were measured assuming a high-temperature current test. The results are illustrated in FIG. 8. The horizontal axis of FIG. 8 represents the threshold voltage, and the vertical axis of FIG. 8 represents the gate leakage current at 150° C.

From the viewpoint of reliability, the gate leakage current at 150° C. is preferably $1.0 \times 10^{-5}$ A/mm or less. In the configuration A, the gate leakage current was less than $1.0 \times 10^{-5}$ A/mm. In contrast, in the Configurations B and C, the gate leakage current was more than $1.0 \times 10^{-5}$ A/mm. As illustrated in FIG. 8, the gate leakage current was larger when the threshold voltage was deeper, that is, when the threshold voltage was negative and the absolute value thereof was larger.

The compositions of compound semiconductor layers included in the semiconductor laminate structure are not limited to those described in the embodiments described above. For example, nitride semiconductors such as InAlN and InGaAlN may be used. In addition, compound semiconductors such as InP may be used.

The order of processes in the manufacturing method of the present disclosure is not limited to that described in the above embodiments. For example, the insulating layer may be formed before the source electrode and the drain electrode.

Fourth Embodiment

Figure 9:
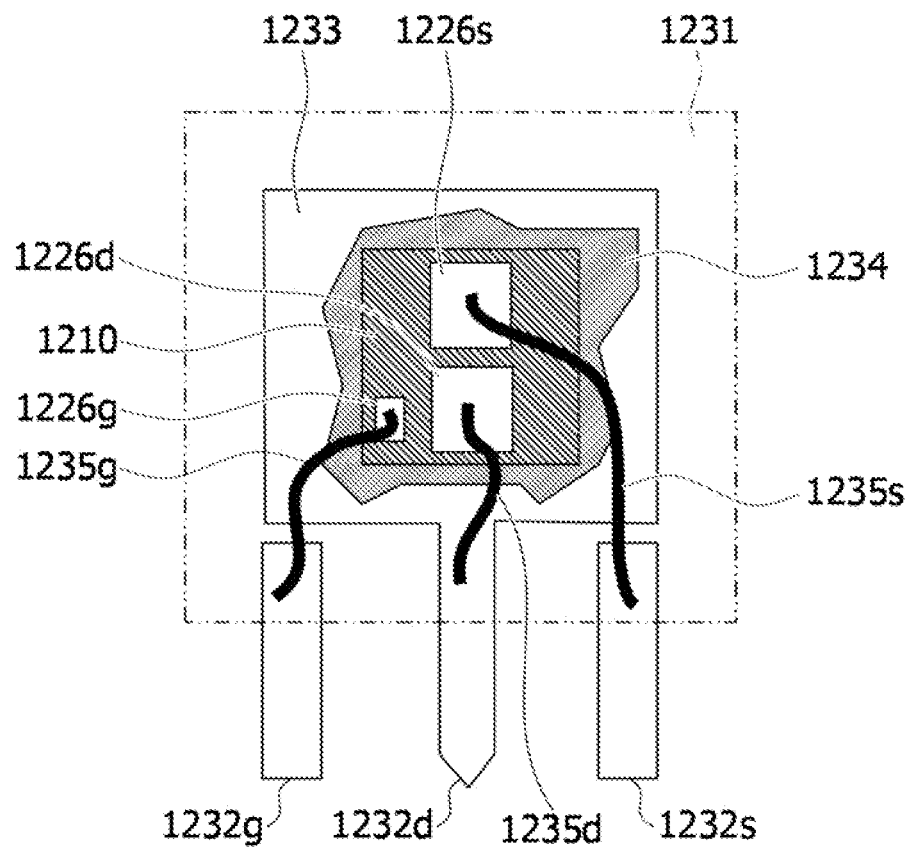
FIG. 9 is a diagram illustrating a discrete package according to a fourth embodiment.

Next, a fourth embodiment is described. The fourth embodiment relates to a discrete package of an HEMT. FIG. 9 is a diagram illustrating the discrete package according to the fourth embodiment.

In the fourth embodiment, as illustrated in FIG. 9, the back side of a compound semiconductor device 1210 having a structure similar to any one of the first to third embodiments is fixed to a land (die pad) 1233 by using a die attaching agent 1234 such as solder. A first end of a wire 1235d such as an Al wire is coupled to a drain pad 1226d to which the drain electrode 114 or 214 is coupled, and a second end of the wire 1235d is coupled to a drain lead 1232d integrated with the land 1233. A first end of a wire 1235s such as an Al wire is coupled to a source pad 1226s to which the source electrode 113 or 213 is coupled, and a second end of the wire 1235s is coupled to a source lead 1232s independent from the land 1233. A first end of a wire 1235g such as an Al wire is coupled to a gate pad 1226g to which the gate electrode 130 or 230 is coupled, and a second end of the wire 1235g is coupled to a gate lead 1232g independent from the land 1233. Further, the land 1233, the compound semiconductor device 1210, and so forth are packaged by a mold resin 1231 such that part of the gate lead 1232g, part of the drain lead 1232d, and part of the source lead 1232s project.

For example, such a discrete package may be manufactured as follows. First, the compound semiconductor device 1210 is fixed to the land 1233 of a lead frame by using the die attaching agent 1234 such as solder. Next, via bonding using the wires 1235g, 1235d, and 1235s, the gate pad 1226g is coupled to the gate lead 1232g of the lead frame, the drain pad 1226d is coupled to the drain lead 1232d of the lead frame, and the source pad 1226s is coupled to the source lead 1232s of the lead frame. Then, sealing is performed by a transfer mold method using the mold resin 1231. Subsequently, the lead frame is cut off.

Fifth Embodiment

Figure 10:
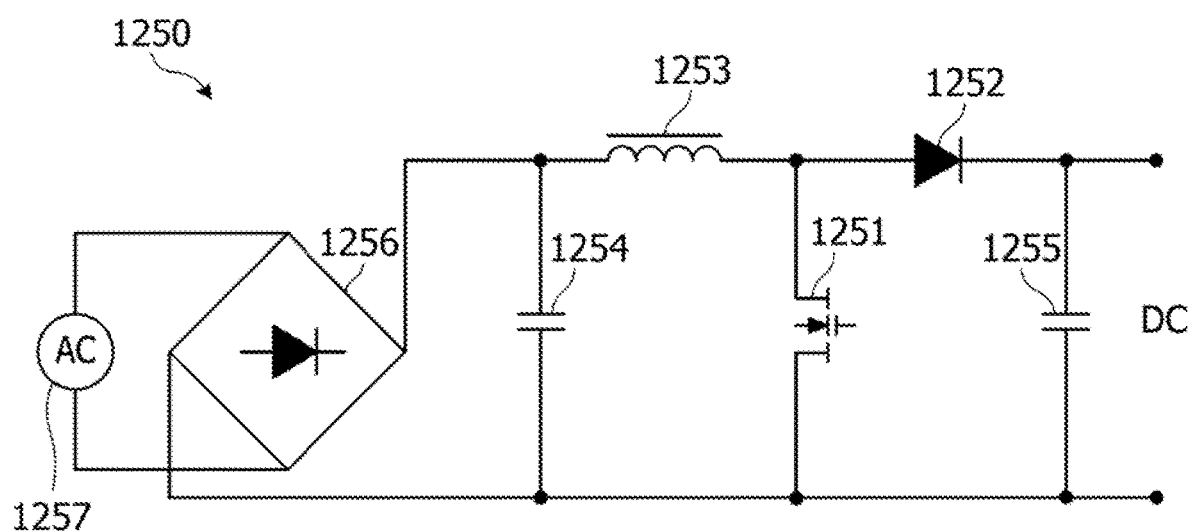
FIG. 10 is a connection diagram illustrating a PFC circuit according to a fifth embodiment.

Next, a fifth embodiment is described. The fifth embodiment relates to a power factor correction (PFC) circuit including an HEMT. FIG. 10 is a connection diagram illustrating the PFC circuit according to the fifth embodiment.

A PFC circuit 1250 includes a switch element (transistor) 1251, a diode 1252, a choke coil 1253, capacitors 1254 and 1255, a diode bridge 1256, and an alternate current power source (AC) 1257. A drain electrode of the switch element 1251 is coupled to an anode terminal of the diode 1252 and a first terminal of the choke coil 1253. A source electrode of the switch element 1251 is coupled to a first terminal of the capacitor 1254 and a first terminal of the capacitor 1255. A second terminal of the capacitor 1254 is coupled to a second terminal of the choke coil 1253. A second terminal of the capacitor 1255 is coupled to a cathode terminal of the diode 1252. A gate driver is coupled to a gate electrode of the switch element 1251. The AC 1257 is coupled to the first and second terminals of the capacitor 1254 with the diode bridge 1256 therebetween. A direct current power source (DC) is coupled to the first and second terminals of the capacitor 1255. In the present embodiment, a compound semiconductor device having a similar structure to any one of the first to third embodiments is used as the switch element 1251.

When manufacturing the PFC circuit 1250, for example, the switch element 1251 is coupled to the diode 1252, the choke coil 1253, and so forth by using solder or the like.

Sixth Embodiment

Figure 11:
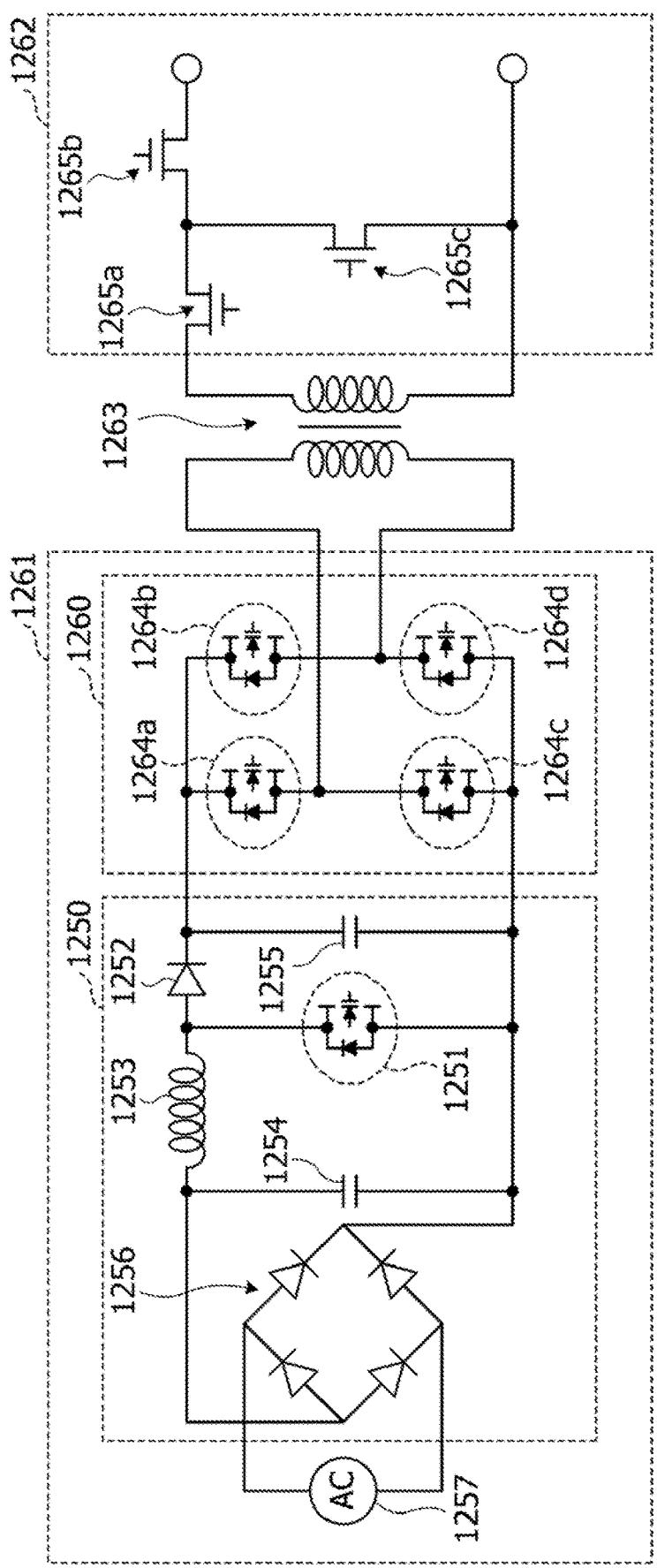
FIG. 11 is a connection diagram illustrating a power source apparatus according to a sixth embodiment.

Next, a sixth embodiment is described. The sixth embodiment relates to a power source apparatus including an HEMT that is suitable for a server power source. FIG. 11 is a connection diagram illustrating the power source apparatus according to the sixth embodiment.

The power source apparatus includes a primary circuit 1261 of high voltage, a secondary circuit 1262 of low voltage, and a transformer 1263 provided between the primary circuit 1261 and the secondary circuit 1262.

The primary circuit 1261 includes the PFC circuit 1250 according to the fifth embodiment, and an inverter circuit coupled to the first and second terminals of the capacitor 1255 of the PFC circuit 1250, for example, a full-bridge inverter circuit 1260. The full-bridge inverter circuit 1260 includes a plurality of (in this case, four) switch elements 1264a, 1264b, 1264c, and 1264d.

The secondary circuit 1262 includes a plurality of (in this case, three) switch elements 1265a, 1265b, and 1265c.

In the present embodiment, compound semiconductor devices having similar structures to any one of the first to third embodiments are used for the switch element 1251 of the PFC circuit 1250 constituting the primary circuit 1261 and the switch elements 1264a, 1264b, 1264c, and 1264d of the full-bridge inverter circuit 1260. In contrast, normal metal-insulator-semiconductor-type field effect transistors (MIS-FETs) formed from silicon are used for the switch elements 1265a, 1265b, and 1265c of the secondary circuit 1262.

Seventh Embodiment

Figure 12:
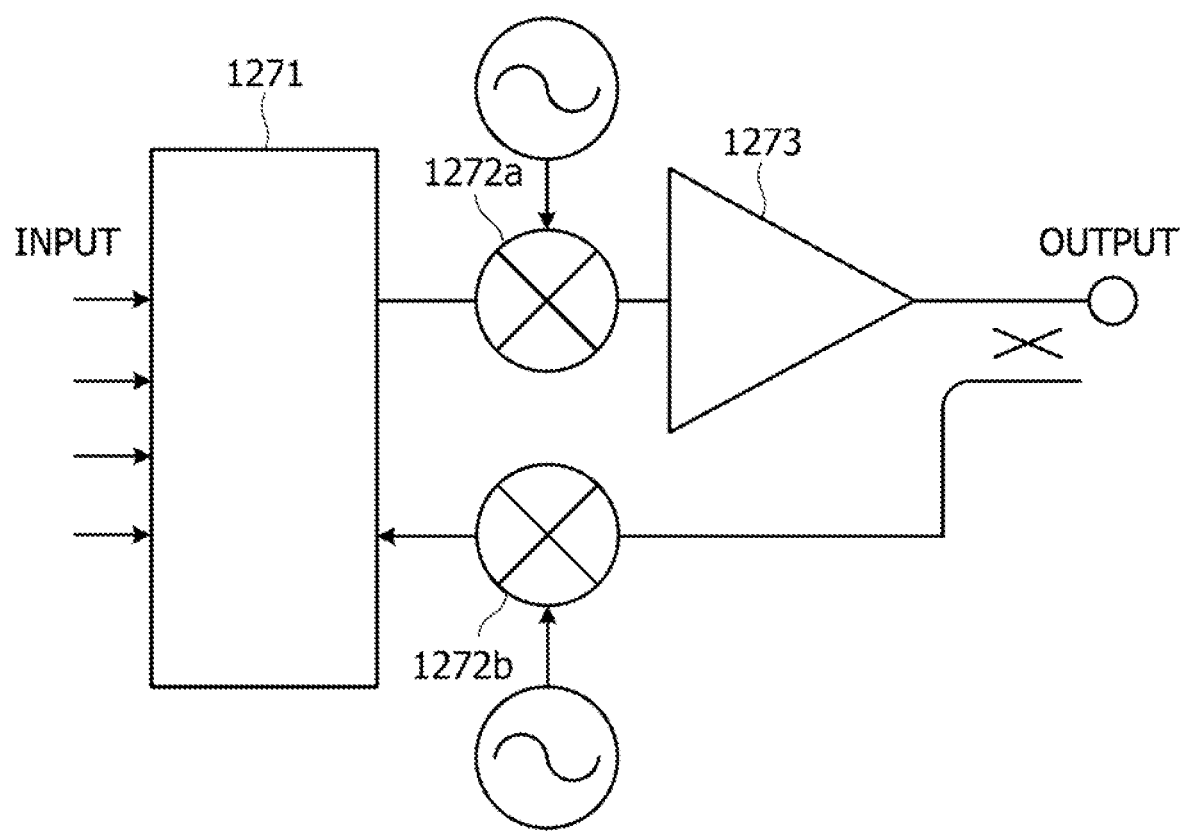
FIG. 12 is a connection diagram illustrating an amplifier according to a seventh embodiment.

Next, a seventh embodiment is described. The seventh embodiment relates to an amplifier including an HEMT. FIG. 12 is a connection diagram illustrating an amplifier according to the seventh embodiment.

The amplifier includes a digital predistortion circuit 1271, mixers 1272a and 1272b, and a power amplifier 1273.

The digital predistortion circuit 1271 compensates nonlinear distortion of an input signal. The mixer 1272a mixes the input signal whose nonlinear distortion has been compensated with an alternate current signal. The power amplifier 1273 includes a compound semiconductor device having a similar structure to any one of the first to third embodiments, and amplifies the input signal mixed with the alternate current signal. In the present embodiment, for example, by switching a switch, an output signal may be mixed with an alternate current signal in the mixer 1272b and transmitted to the digital predistortion circuit 1271. This amplifier may be used as a high-frequency amplifier or a high-output amplifier. The high-frequency amplifier may be used for, for example, a communication apparatus used in a mobile phone base station, a radar apparatus, and a microwave generation apparatus.

Although the preferred embodiments and the like have been described in detail, the above-described embodiments and the like are not limiting. Various modifications and various types of replacement may be added to the above-described embodiments and the like without departing from the scope of the present disclosure.

Hereinafter, aspects of the present disclosure will be collectively described as supplementary notes.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
    a semiconductor laminate structure including an electron transit layer and an electron supply layer that are formed from a compound semiconductor;
    a gate electrode, a source electrode, and a drain electrode that are provided above the electron supply layer; and
    an insulating layer that is provided between the source electrode and the drain electrode, over the semiconductor laminate structure, and with a gate recess formed therein,
    wherein the gate electrode includes:
        a first portion in the gate recess; and
        a second portion that is coupled to the first portion and is provided over the insulating layer at a position further on the drain electrode side than the gate recess,
    wherein the insulating layer includes an aluminum oxide film in direct contact with the semiconductor laminate structure,
    wherein the aluminum oxide film is at least located between the second portion and the semiconductor laminate structure in a thickness direction of the insulating layer, and
    wherein, when a composition of the aluminum oxide film is expressed as $AlO_x$, a value of x is larger than 1.5.

2. The compound semiconductor device according to claim 1,
    wherein the aluminum oxide film is also located between the first portion and the semiconductor laminate structure in the thickness direction of the insulating layer.

3. The compound semiconductor device according to claim 2,
    wherein the first portion is in direct contact with the aluminum oxide film.

4. The compound semiconductor device according to claim 1,
    wherein the insulating layer includes a silicon nitride film over the aluminum oxide film.

5. The compound semiconductor device according to claim 4,
    wherein the first portion includes a nickel film in direct contact with the silicon nitride film.

6. The compound semiconductor device according to claim 1,
    wherein a part of the semiconductor laminate structure between the first portion and the source electrode is exposed from the aluminum oxide film.

7. The compound semiconductor device according to claim 1,
    wherein a thickness of the aluminum oxide film 5 nm or less.

8. A method for manufacturing a compound semiconductor device, the method comprising:
    preparing a semiconductor laminate structure including an electron transit layer and an electron supply layer that are formed from a compound semiconductor;
    forming a source electrode and a drain electrode above the electron supply layer;
    forming an insulating layer between the source electrode and the drain electrode and over the semiconductor laminate structure;
    forming a gate recess in the insulating layer; and
    forming a gate electrode including a first portion in the gate recess and a second portion coupled to the first portion and provided over the insulating layer at a position further on the drain electrode side than the gate recess,
    wherein the forming of the insulating layer includes:
        forming an aluminum oxide film in direct contact with the semiconductor laminate structure; and
        subjecting the aluminum oxide film to heat treatment in an oxidizing atmosphere such that a value of x is larger than 1.5 when a composition of the aluminum oxide film is expressed as $AlO_x$ and
    wherein the aluminum oxide film is at least located between the second portion and the semiconductor laminate structure in a thickness direction of the insulating layer.

9. The method according to claim 8,
    wherein the oxidizing atmosphere is an atmosphere containing water vapor, oxygen, carbon dioxide, carbon monoxide, nitrogen dioxide, nitrogen monoxide, or any combination of these.

10. The method according to claim 8,
    wherein the aluminum oxide film is formed by an atomic layer deposition method using an oxygen plasma or ozone as an oxygen source.

11. An amplifier comprising:
    a digital predistortion circuit configured to compensate nonlinear distortion of an input signa;
    a mixer configured to mix the input signal from the digital predistortion circuit with an alternate current signal; and
    a power amplifier including a compound semiconductor device and configured to amplify the input signal from the mixer,
    wherein the compound semiconductor device includes:
    a semiconductor laminate structure including an electron transit layer and an electron supply layer that are formed from a compound semiconductor;
        a gate electrode, a source electrode, and a drain electrode that are provided above the electron supply layer; and
        an insulating layer that is provided between the source electrode and the drain electrode, over the semiconductor laminate structure, and with a gate recess formed therein,
        wherein the gate electrode includes:
            a first portion in the gate recess; and
            a second portion that is coupled to the first portion and is provided over the insulating layer at a position further on the drain electrode side than the gate recess,
        wherein the insulating layer includes an aluminum oxide film in direct contact with the semiconductor laminate structure,
        wherein the aluminum oxide film is at least located between the second portion and the semiconductor laminate structure in a thickness direction of the insulating layer, and wherein, when a composition of the aluminum oxide film is expressed as $AlO_x$, a value of x is larger than 1.5.

* * * * *